United States Patent
Yao et al.

(10) Patent No.: US 12,031,412 B2
(45) Date of Patent: Jul. 9, 2024

(54) SIMULATION EXPERIMENTAL SYSTEM AND METHOD FOR REAL-TIME OPTIMIZATION AND ADJUSTMENT OF SMART OILFIELD INJECTION PRODUCTION

(71) Applicant: CHINA UNIVERSITY OF PETROLEUM (EAST CHINA), Qingdao (CN)

(72) Inventors: Jun Yao, Qingdao (CN); Junrong Liu, Qingdao (CN); Kai Zhang, Qingdao (CN); Wei Wang, Qingdao (CN); Qingqing Jiao, Qingdao (CN); Shujing Liu, Qingdao (CN)

(73) Assignee: CHINA UNIVERSITY OF PETROLEUM (EAST CHINA), Qingdao (CN)

( * ) Notice: Subject to any disclaimer, the term of this patent is extended or adjusted under 35 U.S.C. 154(b) by 633 days.

(21) Appl. No.: 17/369,547

(22) Filed: Jul. 7, 2021

(65) Prior Publication Data
US 2022/0010657 A1 Jan. 13, 2022

(30) Foreign Application Priority Data
Jul. 7, 2020 (CN) .......................... 202010654190.4

(51) Int. Cl.
*E21B 41/00* (2006.01)
*E21B 34/06* (2006.01)
(Continued)

(52) U.S. Cl.
CPC .......... *E21B 41/0035* (2013.01); *E21B 34/06* (2013.01); *E21B 43/12* (2013.01);
(Continued)

(58) Field of Classification Search
CPC ...... E21B 41/0035; E21B 47/07; E21B 34/06; E21B 43/12; E21B 43/16; E21B 2200/02; G06F 30/28
See application file for complete search history.

(56) References Cited

U.S. PATENT DOCUMENTS

2013/0180327 A1* 7/2013 Frederick .............. B29C 64/112
73/152.01

FOREIGN PATENT DOCUMENTS

CN 106827170 A * 6/2017 ............... B28B 1/00
CN 108961409 A * 12/2018 ............. G06T 17/20

OTHER PUBLICATIONS

Zhang L, Zhou F, Mou J, Pournik M, Tao S, Wang D, Wang Y. Large-scale true tri-axial fracturing experimental investigation on diversion behavior of fiber using 3D printing model of rock formation. Journal of Petroleum Science and Engineering. Oct. 1, 2019; 181:106171. (Year: 2019).*

(Continued)

*Primary Examiner* — Chuen-Meei Gan
(74) *Attorney, Agent, or Firm* — HAUPTMAN HAM, LLP

(57) ABSTRACT

A system for real-time optimization and adjustment of smart oilfield injection production includes a closed rectangular reservoir simulation box, a reservoir 3D-printed physical model, a simulation production horizontal wellbore system, a simulation injection horizontal wellbore system, a fluid supply system, a fluid collection system, a power fluid system and a computer data collection and control system. The reservoir 3D-printed physical model is in the closed rectangular reservoir simulation box. The simulation production horizontal wellbore system and the simulation injection horizontal wellbore system are in the reservoir 3D-printed physical model. The fluid supply system injects a displacement fluid into the simulation injection horizontal (Continued)

wellbore system in the reservoir 3D-printed physical model to flow to the simulation production horizontal wellbore system. The computer data collection and control system adjusts injection and production volumes of different well sections of the simulation injection horizontal wellbore system and the simulation production horizontal wellbore system.

9 Claims, 1 Drawing Sheet

(51) Int. Cl.
*E21B 43/12* (2006.01)
*E21B 43/16* (2006.01)
*E21B 47/07* (2012.01)
*G06F 30/28* (2020.01)

(52) U.S. Cl.
CPC .............. *E21B 43/16* (2013.01); *E21B 47/07* (2020.05); *G06F 30/28* (2020.01); *E21B 2200/20* (2020.05)

(56) References Cited

OTHER PUBLICATIONS

Zhang L, Zhou F, Mou J, Feng W, Li Z, Zhang S. An integrated experimental method to investigate tool-less temporary-plugging multistage acid fracturing of horizontal well by using self-degradable diverters. SPE Journal. Jun. 11, 2020;25(03):1204-19. (Year: 2020).*

* cited by examiner

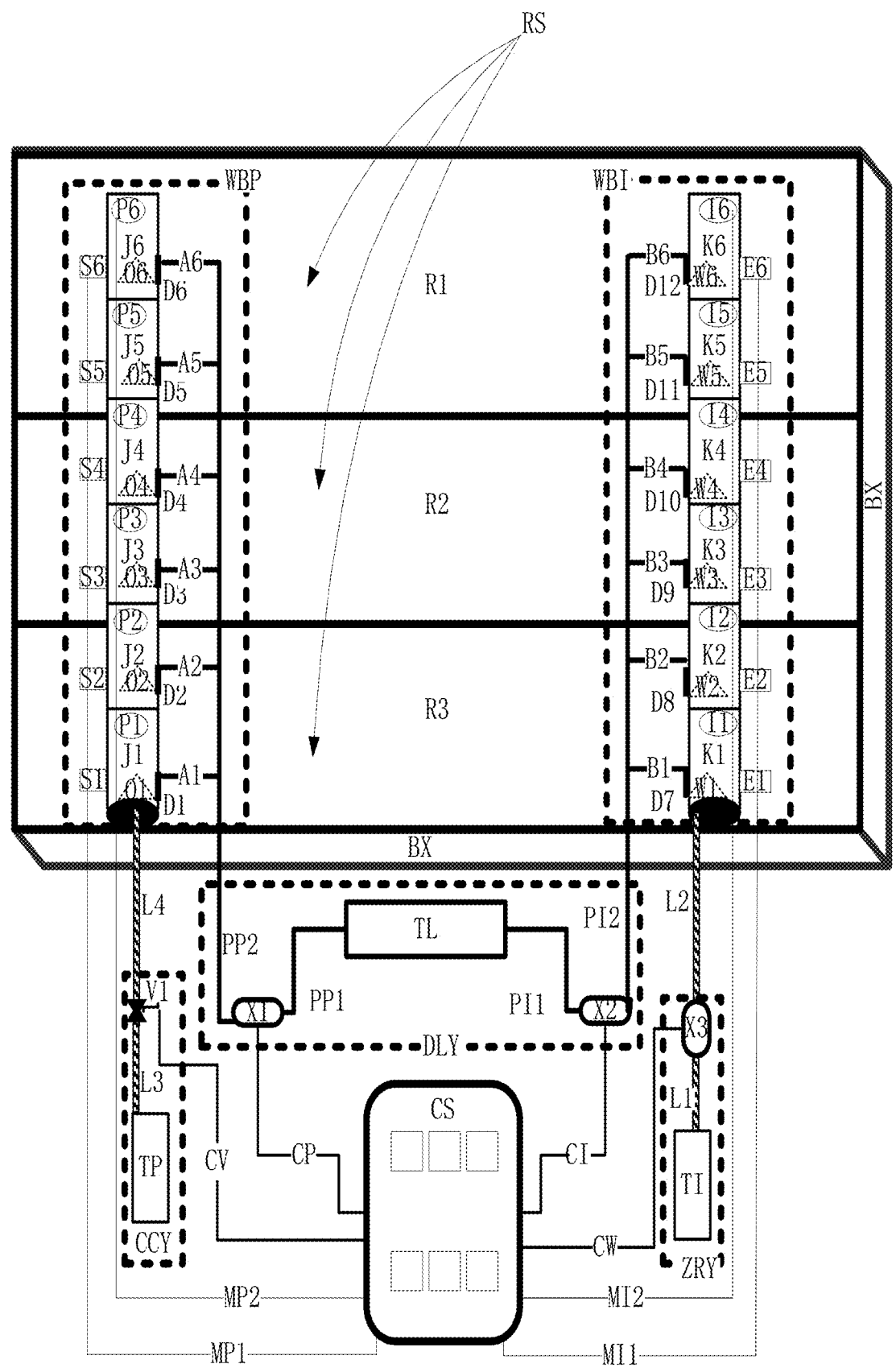

2

SIMULATION EXPERIMENTAL SYSTEM AND METHOD FOR REAL-TIME OPTIMIZATION AND ADJUSTMENT OF SMART OILFIELD INJECTION PRODUCTION

RELATED APPLICATIONS

The present application claims priority from Chinese Application Number 2020106541904, filed Jul. 7, 2020, the disclosure of which is hereby incorporated by reference herein in its entirety.

TECHNICAL FIELD

The present disclosure relates to the field of oil and gas production technologies, and in particular to a simulation experimental system and method for real-time optimization and adjustment of smart oilfield injection production.

BACKGROUND

In China, more than 70% of oil reservoirs are developed by water drive, and more than 80% of crude oil production comes from water-drive developed oil fields. Over many years of production, the water contents of a large number of oilfields already have reached more than 90% at present, highlighting the contradiction of injection and production and deteriorating the development effect. Nowadays, it is a big challenge to improve the recovery rate of such oil reservoirs.

Performing real-time optimization and adjustment for reservoir injection production by monitoring production developments of reservoirs and wellbores in real time in combination with remote downhole flow control technology becomes an important topic of the current smart oilfield construction. Traditional downhole temperature and pressure monitoring can only reflect a production state after fluid enters the wellbore, and the downhole flow control adopted hereby is a type of passive production management. Once water and gas break through the wellbore, it is difficult to carry out production control. If water-drive and gas-drive fronts in the reservoir can be obtained by the corresponding monitoring approaches before water and gas reach the wellbore, the downhole flow control measures can be adopted to slow down the breakthrough of water and gas in the wellbore, and achieve active production management. Thus, it is expected to greatly improve the crude oil recovery rate of the reservoir.

In recent years, the development of streaming potential monitoring technology and real-time production optimization technology lays a foundation for real-time adjustment of water-drive reservoir injection production. Therefore, it is particularly necessary to establish a simulation experimental system and method for real-time optimization and adjustment of smart oilfield injection production for studying a water-drive reservoir injection production adjustment mechanism and verifying a water-drive reservoir injection production real-time optimization theory.

SUMMARY

To overcome the above defects in the prior art, the present disclosure provides a simulation experimental system and method for real-time optimization and adjustment of smart oilfield injection production.

To achieve the above objectives, the present disclosure adopts the following technical solution.

A simulation experimental apparatus for real-time optimization and adjustment of smart oilfield injection production includes a high-temperature and high-pressure closed rectangular reservoir simulation box, a reservoir 3D-printed physical model, a simulation production horizontal wellbore system, a simulation injection horizontal wellbore system, a fluid supply system, a fluid collection system, a power fluid system and a computer data collection and control system. The reservoir 3D-printed physical model is placed in the high-temperature and high-pressure closed rectangular reservoir simulation box, the simulation production horizontal wellbore system and the simulation injection horizontal wellbore system are arranged at the left and right sides in the reservoir 3D-printed physical model respectively to simulate two horizontal wells, that is, one injection well and one production well; the fluid supply system injects a displacement fluid into the simulation injection horizontal wellbore system to displace a fluid in the reservoir 3D-printed physical model to flow to the simulation production horizontal wellbore system and enter the fluid collection system; the computer data collection and control system collects temperature, pressure and streaming potential data of different well sections of the simulation injection horizontal wellbore system and the simulation production horizontal wellbore system, calculates and analyzes the data to form an optimal injection production plan, and then sends instructions to the power fluid system to adjust injection and production volumes of different well sections of the simulation injection horizontal wellbore system and the simulation production horizontal wellbore system.

Compared with the prior art, the present disclosure has the following beneficial effects. The production process of real-time monitoring and real-time adjustment of the water-drive reservoir may be simulated with a simulation scenario close to the actual oilfield production; the real-time injection production optimization result is fed back to an injection production well flow control valve for flow control, realizing an integrated and seamless connection of software and hardware; passive production management and active production management of different heterogeneous reservoirs and different well patterns and well types may also be implemented in polymer-drive, chemical-drive and gas-drive experiments in addition to the water-drive simulation experiments.

BRIEF DESCRIPTION OF THE DRAWINGS

FIG. 1 is a structural schematic diagram of a simulation experimental system for real-time optimization and adjustment of smart oilfield injection production.

Numerals of the drawing are described as follows:

BX: High-temperature and high-pressure closed rectangular reservoir simulation box;

RS: Reservoir 3D-printed physical model; R1: first reservoir 3D-printed physical model; R2: second reservoir 3D-printed physical model; R3: third reservoir 3D-printed physical model;

WBP: Simulation production horizontal wellbore system; J1: First simulation production well section; J2: second simulation production well section; J3: third simulation production well section; J4: fourth simulation production well section; J5: fifth simulation production well section; J6: sixth simulation production well section;

O1: First production horizontal wellbore flow control valve; O2: second production horizontal wellbore flow control valve; O3: third production horizontal wellbore flow control valve; O4: fourth production horizontal wellbore flow control valve; O5: fifth production horizontal wellbore flow control valve; O6: sixth production horizontal wellbore flow control valve;

D1: First production horizontal wellbore hydraulic decoder; D2: second production horizontal wellbore hydraulic decoder; D3: third production horizontal wellbore hydraulic decoder; D4: fourth production horizontal wellbore hydraulic decoder; D5: fifth production horizontal wellbore hydraulic decoder; D6: sixth production horizontal wellbore hydraulic decoder;

P1: First production horizontal wellbore internal temperature-pressure integrated sensor; P2: second production horizontal wellbore internal temperature-pressure integrated sensor; P3: third production horizontal wellbore internal temperature-pressure integrated sensor; P4: fourth production horizontal wellbore internal temperature-pressure integrated sensor; P5: fifth production horizontal wellbore internal temperature-pressure integrated sensor; P6: sixth production horizontal wellbore internal temperature-pressure integrated sensor;

A1: First production horizontal wellbore hydraulic decoder high-pressure integrated control pipeline; A2: second production horizontal wellbore hydraulic decoder high-pressure integrated control pipeline; A3: third production horizontal wellbore hydraulic decoder high-pressure integrated control pipeline; A4: fourth production horizontal wellbore hydraulic decoder high-pressure integrated control pipeline; A5: fifth production horizontal wellbore hydraulic decoder high-pressure integrated control pipeline; A6: sixth production horizontal wellbore hydraulic decoder high-pressure integrated control pipeline;

S1: First production horizontal wellbore external temperature-pressure-streaming potential integrated sensor; S2: second production horizontal wellbore external temperature-pressure-streaming potential integrated sensor; S3: third production horizontal wellbore external temperature-pressure-streaming potential integrated sensor; S4: fourth production horizontal wellbore external temperature-pressure-streaming potential integrated sensor; S5: fifth production horizontal wellbore external temperature-pressure-streaming potential integrated sensor; S6: sixth production horizontal wellbore external temperature-pressure-streaming potential integrated sensor;

WBI: Simulation injection horizontal wellbore system;

K1: First simulation injection well section; K2: second simulation injection well section; K3: third simulation injection well section; K4: fourth simulation injection well section; K5: fifth simulation injection well section; K6: sixth simulation injection well section;

W1: First injection horizontal wellbore flow control valve; W2: second injection horizontal wellbore flow control valve; W3: third injection horizontal wellbore flow control valve; W4: fourth injection horizontal wellbore flow control valve; W5: fifth injection horizontal wellbore flow control valve; W6: sixth injection horizontal wellbore flow control valve;

D7: First injection horizontal wellbore hydraulic decoder; D8: second injection horizontal wellbore hydraulic decoder; D9: third injection horizontal wellbore hydraulic decoder; D10: fourth injection horizontal wellbore hydraulic decoder; D11: fifth injection horizontal wellbore hydraulic decoder; D12: sixth injection horizontal wellbore hydraulic decoder;

I1: First injection horizontal wellbore internal temperature-pressure integrated sensor; I2: second injection horizontal wellbore internal temperature-pressure integrated sensor; I3: third injection horizontal wellbore internal temperature-pressure integrated sensor; I4: fourth injection horizontal wellbore internal temperature-pressure integrated sensor; I5: fifth injection horizontal wellbore internal temperature-pressure integrated sensor; I6: sixth injection horizontal wellbore internal temperature-pressure integrated sensor;

B1: First injection horizontal wellbore hydraulic decoder high-pressure integrated control pipeline; B2: second injection horizontal wellbore hydraulic decoder high-pressure integrated control pipeline; B3: third injection horizontal wellbore hydraulic decoder high-pressure integrated control pipeline; B4: fourth injection horizontal wellbore hydraulic decoder high-pressure integrated control pipeline; B5: fifth injection horizontal wellbore hydraulic decoder high-pressure integrated control pipeline; B6: sixth injection horizontal wellbore hydraulic decoder high-pressure integrated control pipeline;

E1: First injection horizontal wellbore external temperature-pressure-streaming potential integrated sensor; E2: second injection horizontal wellbore external temperature-pressure-streaming potential integrated sensor; E3: third injection horizontal wellbore external temperature-pressure-streaming potential integrated sensor; E4: fourth injection horizontal wellbore external temperature-pressure-streaming potential integrated sensor; E5: fifth injection horizontal wellbore external temperature-pressure-streaming potential integrated sensor; E6: sixth injection horizontal wellbore external temperature-pressure-streaming potential integrated sensor;

TP: Fluid collection tank; TI: fluid supply tank; TL: high-pressure power fluid storage tank; X1: production horizontal wellbore hydraulic decoder drive system; X2: injection horizontal wellbore hydraulic decoder drive system; X3: injection horizontal wellbore plunger pump; CS: computer data collection and control system; MP1: production horizontal wellbore external temperature-pressure-streaming potential integrated sensor data collection line; MP2: production horizontal wellbore internal temperature-pressure integrated sensor data collection line; MI1: injection horizontal wellbore external temperature-pressure-streaming potential integrated sensor data collection line; MI2: injection horizontal wellbore internal temperature-pressure integrated sensor data collection line; L1: fluid supply tank fluid discharge pipeline; L2: injection horizontal wellbore high-pressure injection pipeline; L3: fluid collection tank fluid collection pipeline; L4: production horizontal wellbore high-pressure outflow pipeline; PP1: production horizontal wellbore high-pressure power fluid storage tank output pipeline; PP2: production horizontal wellbore hydraulic decoder high-pressure power fluid integrated pipeline; PI1: injection horizontal wellbore high-pressure power fluid storage tank output pipeline; PI2: injection horizontal wellbore hydraulic decoder high-pressure power fluid integrated pipeline; V1: electric automatically-adjusted back pressure valve; CV: back pressure valve control pipeline; CW: plunger pump control pipeline; CP; production end power fluid control pipeline; and CI: injection end power fluid control pipeline.

DETAILED DESCRIPTION OF THE EMBODIMENTS

FIG. 1 only shows a structural schematic diagram of two horizontal wells including one injection well and one production well in a single-layer injection-production adjustment and production mode. The injection-production adjustment and production modes of different well types, different layers and different well patterns may be combined according to study requirements.

As shown in FIG. 1, a simulation experimental apparatus for real-time optimization and adjustment of smart oilfield injection production includes a high-temperature and high-pressure closed rectangular reservoir simulation box BX, a reservoir 3D-printed physical model RS, a simulation production horizontal wellbore system WBP, a simulation injection horizontal wellbore system WBI, a fluid supply system ZRY, a fluid collection system CCY, a power fluid system DLY and a computer data collection and control system CS. The reservoir 3D-printed physical model RS is placed in the high-temperature and high-pressure closed rectangular reservoir simulation box BX, the simulation production horizontal wellbore system WBP and the simulation injection horizontal wellbore system WBI are arranged at the left and right sides in the reservoir 3D-printed physical model RS respectively to simulate two horizontal wells, that is, one injection well and one production well; the fluid supply system ZRY injects a displacement fluid into the simulation injection horizontal wellbore system WBI to displace a fluid in the reservoir 3D-printed physical model RS to flow to the simulation production horizontal wellbore system WBP and enter the fluid collection system CCY; the computer data collection and control system CS collects temperature, pressure and streaming potential data of different well sections of the simulation injection horizontal wellbore system WBI and the simulation production horizontal wellbore system WBP, calculates and analyzes the data to form an optimal injection production plan, and then sends instructions to the power fluid system DLY to adjust injection and production volumes of different well sections of the simulation injection horizontal wellbore system WBI and the simulation production horizontal wellbore system WBP.

The high-temperature and high-pressure closed rectangular reservoir simulation box BX is a closed hollow rectangular box body with an internal space providing a storage place for the reservoir 3D-printed physical model RS.

The reservoir 3D-printed physical model RS is placed in the high-temperature and high-pressure closed rectangular reservoir simulation box BX to simulate different reservoir types; the reservoir 3D-printed physical model RS may be a homogeneous reservoir 3D-printed physical model or a heterogeneous reservoir 3D-printed physical model; the homogeneous reservoir 3D-printed physical model may be an integrally-printed 3D-printed physical model having both same planar permeability and same longitudinal permeability; the heterogeneous reservoir 3D-printed physical model may be obtained by integrally printing a first reservoir 3D-printed physical model R1, a second reservoir 3D-printed physical model R2 and a third reservoir 3D-printed physical model R3 that are as shown in the drawing and have different permeabilities; the heterogeneous reservoir 3D-printed physical model RS may be a 3D-printed physical model with heterogeneous planar permeability, heterogeneous longitudinal permeability, or with both heterogeneous planar permeability and heterogeneous longitudinal permeability; the heterogeneous reservoir 3D-printed physical model RS has at least two types of different permeabilities; fractures and holes may be disposed in the heterogeneous reservoir 3D-printed physical model RS.

The simulation production horizontal wellbore system WBP simulates sectioned production, monitoring and adjustment of a horizontal production well; the simulation production horizontal wellbore system WBP is arranged at a side of the reservoir 3D-printed physical model RS, and formed by a plurality of simulation production well sections, a plurality of production horizontal wellbore flow control valves and a plurality of production horizontal wellbore hydraulic decoders; the simulation production horizontal wellbore system WBP includes a total of six series-connected simulation production well sections, that is, a first simulation production well section J1, a second simulation production well section J2, a third simulation production well section J3, a fourth simulation production well section J4, a fifth simulation production well section J5 and a sixth simulation production well section J6; a total of six series-connected production horizontal wellbore flow control valves, that is, a first production horizontal wellbore flow control valve O1, a second production horizontal wellbore flow control valve O2, a third production horizontal wellbore flow control valve O3, a fourth production horizontal wellbore flow control valve O4, a fifth production horizontal wellbore flow control valve O5 and a sixth production horizontal wellbore flow control valve O6; and a total of six series-connected production horizontal wellbore hydraulic decoders, that is, a first production horizontal wellbore hydraulic decoder D1, a second production horizontal wellbore hydraulic decoder D2, a third production horizontal wellbore hydraulic decoder D3, a fourth production horizontal wellbore hydraulic decoder D4, a fifth production horizontal wellbore hydraulic decoder D5 and a sixth production horizontal wellbore hydraulic decoder D6; the number of simulation production well sections, the number of production horizontal wellbore flow control valves and the number of production horizontal wellbore hydraulic decoders are in one-to-one correspondence, and one simulation production well section, one production horizontal wellbore flow control valve and one production horizontal wellbore hydraulic decoder form one control unit to realize flow control of one production interval; there are at least two simulation production well sections in the plurality of simulation production well sections, at least two production horizontal wellbore flow control valves in the plurality of production horizontal wellbore flow control valves, and at least two production horizontal wellbore hydraulic decoders in the plurality of production horizontal wellbore hydraulic decoders; the first production horizontal wellbore hydraulic decoder D1, the second production horizontal wellbore hydraulic decoder D2, the third production horizontal wellbore hydraulic decoder D3, the fourth production horizontal wellbore hydraulic decoder D4, the fifth production horizontal wellbore hydraulic decoder D5 and the sixth production horizontal wellbore hydraulic decoder D6 are attached to outsides of the first simulation production well section J1, the second simulation production well section J2, the third simulation production well section J3, the fourth simulation production well section J4, the fifth simulation production well section J5 and the sixth simulation production well section J6 respectively, and connected to the first production horizontal wellbore flow control valve O1, the second production horizontal wellbore flow control valve O2, the third production horizontal wellbore flow control valve O3, the fourth production horizontal wellbore flow control valve O4, the fifth production horizontal wellbore flow control valve O5 and the sixth production horizontal wellbore flow control valve O6 respectively in a direct hydraulic manner; the first production horizontal wellbore hydraulic decoder D1, the second production horizontal wellbore hydraulic decoder D2, the third production horizontal wellbore hydraulic decoder D3, the fourth production horizontal wellbore hydraulic decoder D4, the fifth production horizontal wellbore hydraulic decoder D5 and the sixth production horizontal wellbore hydraulic decoder D6 are connected to production horizontal wellbore hydraulic decoder high-pressure power fluid integrated pipelines PP2 through a first production horizontal wellbore hydraulic decoder high-pressure integrated control pipeline A1, a second production horizontal wellbore hydraulic decoder high-pressure integrated control pipeline A2, a third production horizontal wellbore hydraulic decoder high-pressure integrated control pipeline A3, a fourth production horizontal wellbore hydraulic decoder high-pressure integrated control pipeline A4, a fifth production horizontal wellbore hydraulic decoder high-pressure integrated control pipeline A5 and a sixth production horizontal wellbore hydraulic decoder high-pressure integrated control pipeline A6 respectively; the first production horizontal wellbore internal temperature-pressure integrated sensor P1, the second production horizontal wellbore internal temperature-pressure integrated sensor P2, the third production horizontal wellbore internal temperature-pressure integrated sensor P3, the fourth production horizontal wellbore internal temperature-pressure integrated sensor P4, the fifth production horizontal wellbore internal temperature-pressure integrated sensor P5 and the sixth production horizontal wellbore internal temperature-pressure integrated sensor P6 are arranged inside the first simulation production well section J1, the second simulation production well section J2, the third simulation production well section J3, the fourth simulation production well section J4, the fifth simulation production well section J5 and the sixth simulation production well section J6 respectively, series-connected through production horizontal wellbore internal temperature-pressure integrated sensor data collection lines MP2, and connected to the computer data collection and control system CS; the first production horizontal wellbore external temperature-pressure-streaming potential integrated sensor S1, the second production horizontal wellbore external temperature-pressure-streaming potential integrated sensor S2, the third production horizontal wellbore external temperature-pressure-streaming potential integrated sensor S3, the fourth production horizontal wellbore external temperature-pressure-streaming potential integrated sensor S4, the fifth production horizontal wellbore external temperature-pressure-streaming potential integrated sensor S5 and the sixth production horizontal wellbore external temperature-pressure-streaming potential integrated sensor S6 are arranged at the outsides of the first simulation production well section J1, the second simulation production well section J2, the third simulation production well section J3, the fourth simulation production well section J4, the fifth simulation production well section J5 and the sixth simulation production well section J6 respectively, series-connected through production horizontal wellbore external temperature-pressure-streaming potential integrated sensor data collection lines MP1, and connected to the computer data collection and control system CS.

The simulation injection horizontal wellbore system WBI simulates the sectioned production, monitoring and adjustment of a horizontal injection well; the simulation injection horizontal wellbore system WBI is formed by a plurality of simulation injection well sections, a plurality of injection horizontal wellbore flow control valves and a plurality of injection horizontal wellbore hydraulic decoders; the simulation injection horizontal wellbore system WBI includes a total of six series-connected simulation injection well sections, that is, a first simulation injection well section K1, a second simulation injection well section K2, a third simulation injection well section K3, a fourth simulation injection well section K4, a fifth simulation injection well section K5 and a sixth simulation injection well section K6; a total of six series-connected injection horizontal wellbore flow control valves, that is, a first injection horizontal wellbore flow control valve W1, a second injection horizontal wellbore flow control valve W2, a third injection horizontal wellbore flow control valve W3, a fourth injection horizontal wellbore flow control valve W4, a fifth injection horizontal wellbore flow control valve W5 and a sixth injection horizontal wellbore flow control valve W6; and a total of six series-connected injection horizontal wellbore hydraulic decoders, that is, a first injection horizontal wellbore hydraulic decoder D7, a second injection horizontal wellbore hydraulic decoder D8, a third injection horizontal wellbore hydraulic decoder D9, a fourth injection horizontal wellbore hydraulic decoder D10, a fifth injection horizontal wellbore hydraulic decoder D11 and a sixth injection horizontal wellbore hydraulic decoder D12; the number of simulation injection well sections, the number of injection horizontal wellbore flow control valves and the number of injection horizontal wellbore hydraulic decoders are in one-to-one correspondence, and one simulation injection well section, one injection horizontal wellbore flow control valve and one injection horizontal wellbore hydraulic decoder form one control unit to realize flow control of one injection interval; there are at least two simulation injection well sections in the plurality of simulation injection well sections, at least two injection horizontal wellbore flow control valves in the plurality of injection horizontal wellbore flow control valves, and at least two injection horizontal wellbore hydraulic decoders in the plurality of injection horizontal wellbore hydraulic decoders; the first injection horizontal wellbore hydraulic decoder D7, the second injection horizontal wellbore hydraulic decoder D8, the third injection horizontal wellbore hydraulic decoder D9, the fourth injection horizontal wellbore hydraulic decoder D10, the fifth injection horizontal wellbore hydraulic decoder D11 and the sixth injection horizontal wellbore hydraulic decoder D12 are attached to outsides of the first simulation injection well section K1, the second simulation injection well section K2, the third simulation injection well section K3, the fourth simulation injection well section K4, the fifth simulation injection well section K5 and the sixth simulation injection well section K6 respectively, and connected to the first injection horizontal wellbore flow control valve W1, the second injection horizontal wellbore flow control valve W2, the third injection horizontal wellbore flow control valve W3, the fourth injection horizontal wellbore flow control valve W4, the fifth injection horizontal wellbore flow control valve W5 and the sixth injection horizontal wellbore flow control valve W6 respectively in a direct hydraulic manner; the first injection horizontal wellbore hydraulic decoder D7, the second injection horizontal wellbore hydraulic decoder D8, the third injection horizontal wellbore hydraulic decoder D9, the fourth injection horizontal wellbore hydraulic decoder D10, the fifth injection horizontal wellbore hydraulic decoder D11 and the sixth injection horizontal wellbore hydraulic decoder D12 are connected to injection horizontal wellbore hydraulic decoder high-pressure power fluid integrated pipelines PI2 through a first injection horizontal wellbore hydraulic decoder high-pressure integrated control pipeline B1, a second injection horizontal wellbore hydraulic decoder high-pressure integrated control pipeline B2, a third injection horizontal wellbore hydraulic decoder high-pressure integrated control pipeline B3, a fourth injection horizontal wellbore hydraulic decoder high-pressure integrated control pipeline B4, a fifth injection horizontal wellbore hydraulic decoder high-pressure integrated control pipeline B5 and a sixth injection horizontal wellbore hydraulic decoder high-pressure integrated control pipeline B6 respectively; the first injection horizontal wellbore internal temperature-pressure integrated sensor I1, the second injection horizontal wellbore internal temperature-pressure integrated sensor I2, the third injection horizontal wellbore internal temperature-pressure integrated sensor I3, the fourth injection horizontal wellbore internal temperature-pressure integrated sensor I4, the fifth injection horizontal wellbore internal temperature-pressure integrated sensor I5 and the sixth injection horizontal wellbore internal temperature-pressure integrated sensor I6 are arranged inside the first simulation injection well section K1, the second simulation injection well section K2, the third simulation injection well section K3, the fourth simulation injection well section K4, the fifth simulation injection well section K5 and the sixth simulation injection well section K6 respectively, series-connected through injection horizontal wellbore internal temperature-pressure integrated sensor data collection lines MI2, and connected to the computer data collection and control system CS; the first injection horizontal wellbore external temperature-pressure-streaming potential integrated sensor E1, the second injection horizontal wellbore external temperature-pressure-streaming potential integrated sensor E2, the third injection horizontal wellbore external temperature-pressure-streaming potential integrated sensor E3, the fourth injection horizontal wellbore external temperature-pressure-streaming potential integrated sensor E4, the fifth injection horizontal wellbore external temperature-pressure-streaming potential integrated sensor E5 and the sixth injection horizontal wellbore external temperature-pressure-streaming potential integrated sensor E6 are arranged at the outsides of the first simulation injection well section K1, the second simulation injection well section K2, the third simulation injection well section K3, the fourth simulation injection well section K4, the fifth simulation injection well section K5 and the sixth simulation injection well section K6 respectively, series-connected through injection horizontal wellbore external temperature-pressure-streaming potential integrated sensor data collection lines MI1, and connected to the computer data collection and control system CS.

According to an arrangement of the simulation production horizontal wellbore system WBP and the simulation injection horizontal wellbore system WBI in the reservoir 3D-printed physical model RS, when modeling is performed for the reservoir 3D-printed physical model RS on a computer, the physical model is divided into a plurality of numerical models with the wellbore of the simulation production horizontal wellbore system WBP and the wellbore of the simulation injection horizontal wellbore system WBI taken as a symmetrical axis respectively, and then, a plurality of the divided numerical models are printed respectively; there are at least two numerical models in the plurality of numerical models; the number of the divided physical models printed by using a 3D printer corresponds to the number of numerical models; all of the divided physical models printed by using the 3D printer are combined into a complete reservoir 3D-printed physical model RS.

The simulation production horizontal wellbore system WBP discharges the fluid produced from the reservoir 3D-printed physical model RS into the fluid collection system CCY, and the simulation injection horizontal wellbore system WBI injects an injection fluid of the fluid supply system ZRY into the reservoir 3D-printed physical model RS; the simulation production horizontal wellbore system WBP is connected to the fluid collection system CCY through a production horizontal wellbore high-pressure outflow pipeline L4, and the simulation injection horizontal wellbore system WBI is arranged at the other side of the reservoir 3D-printed physical model RS and connected to the fluid supply system ZRY through an injection horizontal wellbore high-pressure injection pipeline L2; the computer data collection and control system CS is connected to the power fluid system DLY through a production end power fluid control pipeline CP and an injection end power fluid control pipeline CI respectively, and the power fluid system DLY is connected to the simulation production horizontal wellbore system WBP and the simulation injection horizontal wellbore system WBI through the production horizontal wellbore hydraulic decoder high-pressure power fluid integrated pipeline PP2 and the injection horizontal wellbore hydraulic decoder high-pressure power fluid integrated pipeline PI2 respectively.

A plurality of through-holes for the production horizontal wellbore high-pressure outflow pipeline L4, the injection horizontal wellbore high-pressure injection pipeline L2, the production horizontal wellbore external temperature-pressure-streaming potential integrated sensor data collection line MP1, the production horizontal wellbore internal temperature-pressure integrated sensor data collection line MP2, the injection horizontal wellbore external temperature-pressure-streaming potential integrated sensor data collection line MI1, the injection horizontal wellbore internal temperature-pressure integrated sensor data collection line MI2, the production horizontal wellbore hydraulic decoder high-pressure power fluid integrated pipeline PP2, and the injection horizontal wellbore hydraulic decoder high-pressure power fluid integrated pipeline PI2 to enter and exit the high-temperature and high-pressure closed rectangular reservoir simulation box BX are uniformly arranged around the hollow rectangular box body; there are at least 8 through-holes in the plurality of through-holes.

The divided physical model printed by using the 3D printer closely cooperates with the simulation production horizontal wellbore system WBP and the simulation injection horizontal wellbore system WBI to form a physical model with a reservoir and a wellbore coupled.

The physical model with the coupled reservoir and wellbore is placed inside the high-temperature and high-pressure closed rectangular reservoir simulation box BX; a bottom cover and a top cover of the high-temperature and high-pressure closed rectangular reservoir simulation box BX are connected to the hollow rectangular box body by bolts, and the physical model with the coupled reservoir and wellbore is sealed up in the high-temperature and high-pressure closed rectangular reservoir simulation box BX; the physical model with the coupled reservoir and wellbore is tightly bonded at an inner wall surface of the high-temperature and high-pressure closed rectangular reservoir simulation box BX by using a high temperature resistant gel.

Center lines of the first simulation production well section J1, the second simulation production well section J2, the third simulation production well section J3, the fourth simulation production well section J4, the fifth simulation production well section J5 and the sixth simulation production well section J6, the first production horizontal wellbore hydraulic decoder D1, the second production horizontal wellbore hydraulic decoder D2, the third production horizontal wellbore hydraulic decoder D3, the fourth production horizontal wellbore hydraulic decoder D4, the fifth production horizontal wellbore hydraulic decoder D5 and the sixth production horizontal wellbore hydraulic decoder D6, the first production horizontal wellbore external temperature-pressure-streaming potential integrated sensor S1, the second production horizontal wellbore external temperature-pressure-streaming potential integrated sensor S2, the third production horizontal wellbore external temperature-pressure-streaming potential integrated sensor S3, the fourth production horizontal wellbore external temperature-pressure-streaming potential integrated sensor S4, the fifth production horizontal wellbore external temperature-pressure-streaming potential integrated sensor S5 and the sixth production horizontal wellbore external temperature-pressure-streaming potential integrated sensor S6, the first production horizontal wellbore hydraulic decoder high-pressure integrated control pipeline A1, the second production horizontal wellbore hydraulic decoder high-pressure integrated control pipeline A2, the third production horizontal wellbore hydraulic decoder high-pressure integrated control pipeline A3, the fourth production horizontal wellbore hydraulic decoder high-pressure integrated control pipeline A4, the fifth production horizontal wellbore hydraulic decoder high-pressure integrated control pipeline A5 and the sixth production horizontal wellbore hydraulic decoder high-pressure integrated control pipeline A6, the production horizontal wellbore hydraulic decoder high-pressure power fluid integrated pipelines PP2, the production horizontal wellbore external temperature-pressure-streaming potential integrated sensor data collection lines MP1, and the first production horizontal wellbore flow control valve O1, the second production horizontal wellbore flow control valve O2, the third production horizontal wellbore flow control valve O3, the fourth production horizontal wellbore flow control valve O4, the fifth production horizontal wellbore flow control valve O5 and the sixth production horizontal wellbore flow control valve O6 are at the same horizontal position.

Center lines of the first simulation injection well section K1, the second simulation injection well section K2, the third simulation injection well section K3, the fourth simulation injection well section K4, the fifth simulation injection well section K5 and the sixth simulation injection well section K6, the first injection horizontal wellbore hydraulic decoder D7, the second injection horizontal wellbore hydraulic decoder D8, the third injection horizontal wellbore hydraulic decoder D9, the fourth injection horizontal wellbore hydraulic decoder D10, the fifth injection horizontal wellbore hydraulic decoder D11 and the sixth injection horizontal wellbore hydraulic decoder D12, the first injection horizontal wellbore external temperature-pressure-streaming potential integrated sensor E1, the second injection horizontal wellbore external temperature-pressure-streaming potential integrated sensor E2, the third injection horizontal wellbore external temperature-pressure-streaming potential integrated sensor E3, the fourth injection horizontal wellbore external temperature-pressure-streaming potential integrated sensor E4, the fifth injection horizontal wellbore external temperature-pressure-streaming potential integrated sensor E5 and the sixth injection horizontal wellbore external temperature-pressure-streaming potential integrated sensor E6, the first injection horizontal wellbore hydraulic decoder high-pressure integrated control pipeline B1, the second injection horizontal wellbore hydraulic decoder high-pressure integrated control pipeline B2, the third injection horizontal wellbore hydraulic decoder high-pressure integrated control pipeline B3, the fourth injection horizontal wellbore hydraulic decoder high-pressure integrated control pipeline B4, the fifth injection horizontal wellbore hydraulic decoder high-pressure integrated control pipeline B5 and the sixth injection horizontal wellbore hydraulic decoder high-pressure integrated control pipeline B6, the injection horizontal wellbore hydraulic decoder high-pressure power fluid integrated pipeline PI2, the injection horizontal wellbore external temperature-pressure-streaming potential integrated sensor data collection line MI1, and the first injection horizontal wellbore flow control valve W1, the second injection horizontal wellbore flow control valve W2, the third injection horizontal wellbore flow control valve W3, the fourth injection horizontal wellbore flow control valve W4, the fifth injection horizontal wellbore flow control valve W5 and the sixth injection horizontal wellbore flow control valve W6 are at the same horizontal position.

Well types of the simulation production wellbore and the simulation injection wellbore that may be arranged in the reservoir 3D-printed physical model RS include a horizontal well, a vertical well and an inclined well, or a combination thereof; the simulation production wellbore and the simulation injection wellbore arranged in the reservoir 3D-printed physical model RS may be at the same plane or at different planes.

The fluid supply system ZRY provides the injection fluid for the reservoir 3D-printed physical model RS through the simulation injection horizontal wellbore system WBI and includes a fluid supply tank TI and an injection horizontal wellbore plunger pump X3, the fluid supply tank TI is connected to the injection horizontal wellbore plunger pump X3 through a fluid supply tank fluid discharge pipeline L1, and the injection horizontal wellbore plunger pump X3 is connected to the first simulation injection well section K1 of the simulation injection horizontal wellbore system WBI through the injection horizontal wellbore high-pressure injection pipeline L2; the injection fluid in the fluid supply tank TI is pressurized by using the injection horizontal wellbore plunger pump X3 and then enters the simulation injection horizontal wellbore system WBI from the first simulation injection well section K1; the injection horizontal wellbore plunger pump X3 is connected to the computer data collection and control system CS through a plunger pump control pipeline CW to receive a signal transmitted by the computer data collection and control system CS and automatically adjusts a flow of the injection horizontal wellbore plunger pump X3.

The fluid collection system CCY collects the fluid produced from the reservoir 3D-printed physical model RS through the simulation production horizontal wellbore system WBP and controls a back pressure of the simulation production horizontal wellbore system WBP, and includes a fluid collection tank TP and an electric automatically-adjusted back pressure valve V1; the fluid collection tank TP is connected to the electric automatically-adjusted back pressure valve V1 through a fluid collection tank fluid collection pipeline L3, and the electric automatically-adjusted back pressure valve V1 is connected to the first simulation production well section J1 of the simulation production horizontal wellbore system WBP through the production horizontal wellbore high-pressure outflow pipeline L4; an output fluid flowing out of the simulation production horizontal wellbore system WBP sequentially flows through the production horizontal wellbore high-pressure outflow pipeline L4 and the fluid collection tank fluid collection pipeline L3 under the back pressure applied by the electric automatically-adjusted back pressure valve V1 and enters the fluid collection tank TP; the electric automatically-adjusted back pressure valve V1 is connected to the computer data collection and control system CS through a back pressure valve control pipeline CV to receive a signal transmitted by the computer data collection and control system CS, and automatically adjusts the back pressure acting on the simulation production horizontal wellbore system WBP.

The power fluid system DLY provides power for flow adjustment of different well sections in the simulation production horizontal wellbore system WBP and the simulation injection horizontal wellbore system WBI, and includes a production horizontal wellbore hydraulic decoder drive system X1, an injection horizontal wellbore hydraulic decoder drive system X2 and a high-pressure power fluid storage tank TL; the production horizontal wellbore hydraulic decoder drive system X1 is connected to the high-pressure power fluid storage tank TL through a production horizontal wellbore high-pressure power fluid storage tank output pipeline PP1, connected to the computer data collection and control system CS through the production end power fluid control pipeline CP, and connected to the simulation production horizontal wellbore system WBP through the production horizontal wellbore hydraulic decoder high-pressure power fluid integrated pipeline PP2; the injection horizontal wellbore hydraulic decoder drive system X2 is connected to the high-pressure power fluid storage tank TL through an injection horizontal wellbore high-pressure power fluid storage tank output pipeline PI1, connected to the computer data collection and control system CS through the injection end power fluid control pipeline CI, and connected to the simulation injection horizontal wellbore system WBI through the injection horizontal wellbore hydraulic decoder high-pressure power fluid integrated pipeline PI2; the production horizontal wellbore hydraulic decoder high-pressure power fluid integrated pipeline PP2 includes three high-pressure fluid control pipelines connected to three respective high-pressure fluid control pipelines in the first production horizontal wellbore hydraulic decoder high-pressure integrated control pipeline A1, the second production horizontal wellbore hydraulic decoder high-pressure integrated control pipeline A2, the third production horizontal wellbore hydraulic decoder high-pressure integrated control pipeline A3, the fourth production horizontal wellbore hydraulic decoder high-pressure integrated control pipeline A4, the fifth production horizontal wellbore hydraulic decoder high-pressure integrated control pipeline A5 and the sixth production horizontal wellbore hydraulic decoder high-pressure integrated control pipeline A6 respectively, to, by use of different sequences of applying pressures to three high-pressure fluid control pipelines, realize control of the first production horizontal wellbore hydraulic decoder D1, the second production horizontal wellbore hydraulic decoder D2, the third production horizontal wellbore hydraulic decoder D3, the fourth production horizontal wellbore hydraulic decoder D4, the fifth production horizontal wellbore hydraulic decoder D5 and the sixth production horizontal wellbore hydraulic decoder D6.

The injection horizontal wellbore hydraulic decoder high-pressure power fluid integrated pipeline PI2 includes three high-pressure fluid control pipelines connected to three respective high-pressure fluid control pipelines in the first injection horizontal wellbore hydraulic decoder high-pressure integrated control pipeline B1, the second injection horizontal wellbore hydraulic decoder high-pressure integrated control pipeline B2, the third injection horizontal wellbore hydraulic decoder high-pressure integrated control pipeline B3, the fourth injection horizontal wellbore hydraulic decoder high-pressure integrated control pipeline B4, the fifth injection horizontal wellbore hydraulic decoder high-pressure integrated control pipeline B5 and the sixth injection horizontal wellbore hydraulic decoder high-pressure integrated control pipeline B6 respectively, to, by use of different sequences of applying pressures to three high-pressure fluid control pipelines, realize control of the first injection horizontal wellbore hydraulic decoder D7, the second injection horizontal wellbore hydraulic decoder D8, the third injection horizontal wellbore hydraulic decoder D9, the fourth injection horizontal wellbore hydraulic decoder D10, the fifth injection horizontal wellbore hydraulic decoder D11 and the sixth injection horizontal wellbore hydraulic decoder D12.

The computer data collection and control system CS collects temperature, pressure and streaming potential data of the simulation production horizontal wellbore system WBP and the simulation injection horizontal wellbore system WBI, performs flow and reservoir parameter interpretation with a built-in monitoring data processing and interpretation software, and then obtains current pressure and saturation distribution in the reservoir model with a built-in automatic historical fitting software and a built-in production optimization decision-making software and generates an optimal injection production plan, and finally sends control instructions to the power fluid system DLY to control production of the simulation production horizontal wellbore system WBP and the simulation injection horizontal wellbore system WBI.

The computer data collection and control system CS collects temperature, pressure and streaming potential data outside the first simulation production well section J1, the second simulation production well section J2, the third simulation production well section J3, the fourth simulation production well section J4, the fifth simulation production well section J5 and the sixth simulation production well section J6 and temperature and pressure data inside the first simulation production well section J1, the second simulation production well section J2, the third simulation production well section J3, the fourth simulation production well section J4, the fifth simulation production well section J5 and the sixth simulation production well section J6 through production horizontal wellbore external temperature-pressure-streaming potential integrated sensor data collection lines MP1 and production horizontal wellbore internal temperature-pressure integrated sensor data collection lines MP2 respectively, and collects temperature, pressure and streaming potential data outside the first simulation injection well section K1, the second simulation injection well section K2, the third simulation injection well section K3, the fourth simulation injection well section K4, the fifth simulation injection well section K5 and the sixth simulation injection well section K6 and temperature and pressure data inside the first simulation injection well section K1, the second simulation injection well section K2, the third simulation injection well section K3, the fourth simulation injection well section K4, the fifth simulation injection well section K5 and the sixth simulation injection well section K6 through injection horizontal wellbore external temperature-pressure-streaming potential integrated sensor data collection lines MI1 and injection horizontal wellbore internal temperature-pressure integrated sensor data collection lines MI2 respectively; the computer data collection and control system CS sends instructions to the electric automatically-adjusted back pressure valve V1 through the back pressure valve control pipeline CV to control an opening degree of the electric automatically-adjusted back pressure valve V1 and adjust the back pressure of the simulation production horizontal wellbore system WBP; sends instructions to the injection horizontal wellbore plunger pump X3 through the plunger pump control pipeline CW to control working parameters of the injection horizontal wellbore plunger pump X3 and adjust the injected flow of the simulation injection horizontal wellbore system WBI; sends instructions to the injection horizontal wellbore hydraulic decoder drive system X2 through the injection end power fluid control pipeline CI to realize control of the first injection horizontal wellbore flow control valve W1, the second injection horizontal wellbore flow control valve W2, the third injection horizontal wellbore flow control valve W3, the fourth injection horizontal wellbore flow control valve W4, the fifth injection horizontal wellbore flow control valve W5 and the sixth injection horizontal wellbore flow control valve W6 by use of a sequence of applying the pressure to the first injection horizontal wellbore hydraulic decoder D7, the second injection horizontal wellbore hydraulic decoder D8, the third injection horizontal wellbore hydraulic decoder D9, the fourth injection horizontal wellbore hydraulic decoder D10, the fifth injection horizontal wellbore hydraulic decoder D11 and the sixth injection horizontal wellbore hydraulic decoder D12 through the injection horizontal wellbore hydraulic decoder high-pressure power fluid integrated pipeline PI2 by the injection horizontal wellbore hydraulic decoder drive system X2, so as to adjust the flow of the first simulation injection well section K1, the second simulation injection well section K2, the third simulation injection well section K3, the fourth simulation injection well section K4, the fifth simulation injection well section K5 and the sixth simulation injection well section K6; and sends instructions to the production horizontal wellbore hydraulic decoder drive system X1 through the production end power fluid control pipeline CP to realize control of the first production horizontal wellbore flow control valve O1, the second production horizontal wellbore flow control valve O2, the third production horizontal wellbore flow control valve O3, the fourth production horizontal wellbore flow control valve O4, the fifth production horizontal wellbore flow control valve O5 and the sixth production horizontal wellbore flow control valve O6 by use of a sequence of applying the pressure to the first production horizontal wellbore hydraulic decoder D1, the second production horizontal wellbore hydraulic decoder D2, the third production horizontal wellbore hydraulic decoder D3, the fourth production horizontal wellbore hydraulic decoder D4, the fifth production horizontal wellbore hydraulic decoder D5 and the sixth production horizontal wellbore hydraulic decoder D6 through the production horizontal wellbore hydraulic decoder high-pressure power fluid integrated pipeline PP2 by the production horizontal wellbore hydraulic decoder drive system X1 so as to adjust the flow of the first simulation production well section J1, the second simulation production well section J2, the third simulation production well section J3, the fourth simulation production well section J4, the fifth simulation production well section J5 and the sixth simulation production well section J6.

The computer data collection and control system CS has a built-in smart well long-term downhole pressure monitoring data processing and interpretation software 2016SR170270, a built-in reservoir development simulation automatic historical fitting software 2017SR115231 and a built-in smart oilfield development and production optimization decision-making software 2016SR214413, which have been given software copyright.

The smart well long-term downhole pressure monitoring data processing and interpretation software 2016SR170270 performs comprehensive analysis for the temperature, pressure and streaming potential data outside the first simulation production well section J1, the second simulation production well section J2, the third simulation production well section J3, the fourth simulation production well section J4, the fifth simulation production well section J5 and the sixth simulation production well section J6 and the temperature and pressure data inside the first simulation production well section J1, the second simulation production well section J2, the third simulation production well section J3, the fourth simulation production well section J4, the fifth simulation production well section J5 and the sixth simulation production well section J6 collected respectively at a certain time interval through the production horizontal wellbore external temperature-pressure-streaming potential integrated sensor data collection line MP1 and the production horizontal wellbore internal temperature-pressure integrated sensor data collection line MP2 to obtain the respective flows and water contents of the first simulation production well section J1, the second simulation production well section J2, the third simulation production well section J3, the fourth simulation production well section J4, the fifth simulation production well section J5 and the sixth simulation production well section J6 and water-drive front positions in the reservoir 3D-printed physical model RS; and performs comprehensive analysis for the temperature, pressure and streaming potential data outside the first simulation injection well section K1, the second simulation injection well section K2, the third simulation injection well section K3, the fourth simulation injection well section K4, the fifth simulation injection well section K5 and the sixth simulation injection well section K6 and the temperature and pressure data inside the first simulation injection well section K1, the second simulation injection well section K2, the third simulation injection well section K3, the fourth simulation injection well section K4, the fifth simulation injection well section K5 and the sixth simulation injection well section K6 collected respectively at a certain time interval through the injection horizontal wellbore external temperature-pressure-streaming potential integrated sensor data collection line MI1 and the injection horizontal wellbore internal temperature-pressure integrated sensor data collection line MI2, to obtain the respective flows of the first simulation injection well section K1, the second simulation injection well section K2, the third simulation injection well section K3, the fourth simulation injection well section K4, the fifth simulation injection well section K5 and the sixth simulation injection well section K6.

The certain time interval may be 10 seconds, 30 seconds, 60 seconds, 120 seconds, 300 seconds, or any number of seconds.

The reservoir development simulation automatic historical fitting software 2017SR115231 builds a reservoir numerical simulation model with the reservoir 3D-printed physical model RS to perform automatic historical fitting of the reservoir based on the respective flows and water contents of the first simulation production well section J1, the second simulation production well section J2, the third simulation production well section J3, the fourth simulation production well section J4, the fifth simulation production well section J5 and the sixth simulation production well section J6 and water-drive front positions in the reservoir 3D-printed physical model RS and the respective flows of the first simulation injection well section K1, the second simulation injection well section K2, the third simulation injection well section K3, the fourth simulation injection well section K4, the fifth simulation injection well section K5 and the sixth simulation injection well section K6 which are interpreted by the smart well long-term downhole pressure monitoring data processing and interpretation software 2016SR170270, so as to obtain oil-water saturation field distribution in the reservoir 3D-printed physical model RS in the current state.

The smart oilfield development and production optimization decision-making software 2016SR214413 performs injection-production production optimization with a goal of maximizing a recovery rate based on the oil-water saturation field distribution in the reservoir 3D-printed physical model RS in the current state obtained by the reservoir development simulation automatic historical fitting software 2017SR115231, to obtain respective optimal flow parameters of the first simulation production well section J1, the second simulation production well section J2, the third simulation production well section J3, the fourth simulation production well section J4, the fifth simulation production well section J5 and the sixth simulation production well section J6 and the first simulation injection well section K1, the second simulation injection well section K2, the third simulation injection well section K3, the fourth simulation injection well section K4, the fifth simulation injection well section K5 and sixth simulation injection well section K6.

The computer data collection and control system CS sends instructions of the respective optimal flow parameters of the first simulation production well section J1, the second simulation production well section J2, the third simulation production well section J3, the fourth simulation production well section J4, the fifth simulation production well section J5 and the sixth simulation production well section J6 obtained by the smart oilfield development and production optimization decision-making software 2016SR214413 to the production horizontal wellbore hydraulic decoder drive system X1 through the production end power fluid control pipeline CP, to realize automatic adjustment of the respective flows of the first simulation production well section J1, the second simulation production well section J2, the third simulation production well section J3, the fourth simulation production well section J4, the fifth simulation production well section J5 and the sixth simulation production well section J6.

The computer data collection and control system CS sends instructions of the respective optimal flow parameters of the first simulation injection well section K1, the second simulation injection well section K2, the third simulation injection well section K3, the fourth simulation injection well section K4, the fifth simulation injection well section K5 and the sixth simulation injection well section K6 obtained by the smart oilfield development and production optimization decision-making software 2016SR214413 to the injection horizontal wellbore hydraulic decoder drive system X2 through the injection end power fluid control pipeline CI, to realize automatic adjustment of the respective flows of the first simulation injection well section K1, the second simulation injection well section K2, the third simulation injection well section K3, the fourth simulation injection well section K4, the fifth simulation injection well section K5 and the sixth simulation injection well section K6.

A simulation experimental method for real-time optimization and adjustment of smart oilfield injection production of one-injection-one-production horizontal wells of a planar heterogeneous reservoir using the above simulation experimental system for real-time optimization and adjustment of smart oilfield injection production includes the following steps.

At step 1, three planar heterogeneous reservoir models of different permeability regions are designed according to simulation experimental requirements; a physical model and a numerical model of a reservoir 3D-printed physical model RS are built according to outer diameters of a first simulation production well section J1, a second simulation production well section J2, a third simulation production well section J3, a fourth simulation production well section J4, a fifth simulation production well section J5 and a sixth simulation production well section J6, outer diameters of a first simulation injection well section K1, a second simulation injection well section K2, a third simulation injection well section K3, a fourth simulation injection well section K4, a fifth simulation injection well section K5 and a sixth simulation injection well section K6, outer diameters of a first injection horizontal wellbore hydraulic decoder D7, a second injection horizontal wellbore hydraulic decoder D8, a third injection horizontal wellbore hydraulic decoder D9, a fourth injection horizontal wellbore hydraulic decoder D10, a fifth injection horizontal wellbore hydraulic decoder D11 and a sixth injection horizontal wellbore hydraulic decoder D12, outer diameters of a first production horizontal wellbore hydraulic decoder D1, a second production horizontal wellbore hydraulic decoder D2, a third production horizontal wellbore hydraulic decoder D3, a fourth production horizontal wellbore hydraulic decoder D4, a fifth production horizontal wellbore hydraulic decoder D5 and a sixth production horizontal wellbore hydraulic decoder D6, outer diameters of a first production horizontal wellbore external temperature-pressure-streaming potential integrated sensor S1, a second production horizontal wellbore external temperature-pressure-streaming potential integrated sensor S2, a third production horizontal wellbore external temperature-pressure-streaming potential integrated sensor S3, a fourth production horizontal wellbore external temperature-pressure-streaming potential integrated sensor S4, a fifth production horizontal wellbore external temperature-pressure-streaming potential integrated sensor S5 and a sixth production horizontal wellbore external temperature-pressure-streaming potential integrated sensor S6, outer diameters of a first injection horizontal wellbore external temperature-pressure-streaming potential integrated sensor E1, a second injection horizontal wellbore external temperature-pressure-streaming potential integrated sensor E2, a third injection horizontal wellbore external temperature-pressure-streaming potential integrated sensor E3, a fourth injection horizontal wellbore external temperature-pressure-streaming potential integrated sensor E4, a fifth injection horizontal wellbore external temperature-pressure-streaming potential integrated sensor E5 and a sixth injection horizontal wellbore external temperature-pressure-streaming potential integrated sensor E6, outer diameters of a first production horizontal wellbore hydraulic decoder high-pressure integrated control pipeline A1, a second production horizontal wellbore hydraulic decoder high-pressure integrated control pipeline A2, a third production horizontal wellbore hydraulic decoder high-pressure integrated control pipeline A3, a fourth production horizontal wellbore hydraulic decoder high-pressure integrated control pipeline A4, a fifth production horizontal wellbore hydraulic decoder high-pressure integrated control pipeline A5 and a sixth production horizontal wellbore hydraulic decoder high-pressure integrated control pipeline A6, outer diameters of a first injection horizontal wellbore hydraulic decoder high-pressure integrated control pipeline B1, a second injection horizontal wellbore hydraulic decoder high-pressure integrated control pipeline B2, a third injection horizontal wellbore hydraulic decoder high-pressure integrated control pipeline B3, a fourth injection horizontal wellbore hydraulic decoder high-pressure integrated control pipeline B4, a fifth injection horizontal wellbore hydraulic decoder high-pressure integrated control pipeline B5 and a sixth injection horizontal wellbore hydraulic decoder high-pressure integrated control pipeline B6, outer diameters of production horizontal wellbore hydraulic decoder high-pressure power fluid integrated pipelines PP2, outer diameters of injection horizontal wellbore hydraulic decoder high-pressure power fluid integrated pipelines PI2, outer diameters of production horizontal wellbore external temperature-pressure-streaming potential integrated sensor data collection lines MP1, outer diameters of injection horizontal wellbore external temperature-pressure-streaming potential integrated sensor data collection lines MI1 and an internal size of a high-temperature and high-pressure closed rectangular reservoir simulation box BX, where center lines of the first simulation production well section J1, the second simulation production well section J2, the third simulation production well section J3, the fourth simulation production well section J4, the fifth simulation production well section J5 and the sixth simulation production well section J6, the first production horizontal wellbore hydraulic decoder D1, the second production horizontal wellbore hydraulic decoder D2, the third production horizontal wellbore hydraulic decoder D3, the fourth production horizontal wellbore hydraulic decoder D4, the fifth production horizontal wellbore hydraulic decoder D5 and the sixth production horizontal wellbore hydraulic decoder D6, the first production horizontal wellbore external temperature-pressure-streaming potential integrated sensor S1, the second production horizontal wellbore external temperature-pressure-streaming potential integrated sensor S2, the third production horizontal wellbore external temperature-pressure-streaming potential integrated sensor S3, the fourth production horizontal wellbore external temperature-pressure-streaming potential integrated sensor S4, the fifth production horizontal wellbore external temperature-pressure-streaming potential integrated sensor S5 and the sixth production horizontal wellbore external temperature-pressure-streaming potential integrated sensor S6, the first production horizontal wellbore hydraulic decoder high-pressure integrated control pipeline A1, the second production horizontal wellbore hydraulic decoder high-pressure integrated control pipeline A2, the third production horizontal wellbore hydraulic decoder high-pressure integrated control pipeline A3, the fourth production horizontal wellbore hydraulic decoder high-pressure integrated control pipeline A4, the fifth production horizontal wellbore hydraulic decoder high-pressure integrated control pipeline A5 and the sixth production horizontal wellbore hydraulic decoder high-pressure integrated control pipeline A6, the production horizontal wellbore hydraulic decoder high-pressure power fluid integrated pipelines PP2, the production horizontal wellbore external temperature-pressure-streaming potential integrated sensor data collection lines MP1, and a first production horizontal wellbore flow control valve O1, a second production horizontal wellbore flow control valve O2, a third production horizontal wellbore flow control valve O3, a fourth production horizontal wellbore flow control valve O4, a fifth production horizontal wellbore flow control valve O5 and a sixth production horizontal wellbore flow control valve O6 are at the same horizontal line; center lines of the first simulation injection well section K1, the second simulation injection well section K2, the third simulation injection well section K3, the fourth simulation injection well section K4, the fifth simulation injection well section K5 and the sixth simulation injection well section K6, the first injection horizontal wellbore hydraulic decoder D7, the second injection horizontal wellbore hydraulic decoder D8, the third injection horizontal wellbore hydraulic decoder D9, the fourth injection horizontal wellbore hydraulic decoder D10, the fifth injection horizontal wellbore hydraulic decoder D11 and the sixth injection horizontal wellbore hydraulic decoder D12, the first injection horizontal wellbore external temperature-pressure-streaming potential integrated sensor E1, the second injection horizontal wellbore external temperature-pressure-streaming potential integrated sensor E2, the third injection horizontal wellbore external temperature-pressure-streaming potential integrated sensor E3, the fourth injection horizontal wellbore external temperature-pressure-streaming potential integrated sensor E4, the fifth injection horizontal wellbore external temperature-pressure-streaming potential integrated sensor E5 and the sixth injection horizontal wellbore external temperature-pressure-streaming potential integrated sensor E6, the first injection horizontal wellbore hydraulic decoder high-pressure integrated control pipeline B1, the second injection horizontal wellbore hydraulic decoder high-pressure integrated control pipeline B2, the third injection horizontal wellbore hydraulic decoder high-pressure integrated control pipeline B3, the fourth injection horizontal wellbore hydraulic decoder high-pressure integrated control pipeline B4, the fifth injection horizontal wellbore hydraulic decoder high-pressure integrated control pipeline B5 and the sixth injection horizontal wellbore hydraulic decoder high-pressure integrated control pipeline B6, the injection horizontal wellbore hydraulic decoder high-pressure power fluid integrated pipeline PI2, the injection horizontal wellbore external temperature-pressure-streaming potential integrated sensor data collection line MI1, and a first injection horizontal wellbore flow control valve W1, a second injection horizontal wellbore flow control valve W2, a third injection horizontal wellbore flow control valve W3, a fourth injection horizontal wellbore flow control valve W4, a fifth injection horizontal wellbore flow control valve W5 and a sixth injection horizontal wellbore flow control valve W6 are at the same horizontal line; then, the numerical model of the built reservoir 3D-printed physical model RS is divided with well axes of the first simulation production well section J1, the second simulation production well section J2, the third simulation production well section J3, the fourth simulation production well section J4, the fifth simulation production well section J5 and the sixth simulation production well section J6 as the center and well axes of the first simulation injection well section K1, the second simulation injection well section K2, the third simulation injection well section K3, the fourth simulation injection well section K4, the fifth simulation injection well section K5 and the sixth simulation injection well section K6 as the center; and the divided reservoir 3D-printed physical model RS required for an experiment is obtained by printing all of the divided numerical models with a 3D printer.

At step 2, the first production horizontal wellbore flow control valve O1, the second production horizontal wellbore flow control valve O2, the third production horizontal wellbore flow control valve O3, the fourth production horizontal wellbore flow control valve O4, the fifth production horizontal wellbore flow control valve O5 and the sixth production horizontal wellbore flow control valve O6 are sequentially assembled on the first simulation production well section J1, the second simulation production well section J2, the third simulation production well section J3, the fourth simulation production well section J4, the fifth simulation production well section J5 and the sixth simulation production well section J6; the first production horizontal wellbore hydraulic decoder D1, the second production horizontal wellbore hydraulic decoder D2, the third production horizontal wellbore hydraulic decoder D3, the fourth production horizontal wellbore hydraulic decoder D4, the fifth production horizontal wellbore hydraulic decoder D5 and the sixth production horizontal wellbore hydraulic decoder D6 are sequentially connected to the first production horizontal wellbore flow control valve O1, the second production horizontal wellbore flow control valve O2, the third production horizontal wellbore flow control valve O3, the fourth production horizontal wellbore flow control valve O4, the fifth production horizontal wellbore flow control valve O5 and the sixth production horizontal wellbore flow control valve O6, and attached to the outsides of the first simulation production well section J1, the second simulation production well section J2, the third simulation production well section J3, the fourth simulation production well section J4, the fifth simulation production well section J5 and the sixth simulation production well section J6; the first simulation production well section J1, the second simulation production well section J2, the third simulation production well section J3, the fourth simulation production well section J4, the fifth simulation production well section J5 and the sixth simulation production well section J6 are series-connected in sequence to form a simulation horizontal production wellbore; three of the first production horizontal wellbore hydraulic decoder high-pressure integrated control pipeline A1, the second production horizontal wellbore hydraulic decoder high-pressure integrated control pipeline A2, the third production horizontal wellbore hydraulic decoder high-pressure integrated control pipeline A3, the fourth production horizontal wellbore hydraulic decoder high-pressure integrated control pipeline A4, the fifth production horizontal wellbore hydraulic decoder high-pressure integrated control pipeline A5 and the sixth production horizontal wellbore hydraulic decoder high-pressure integrated control pipeline A6 are connected to three of the production horizontal wellbore hydraulic decoder high-pressure power fluid integrated pipelines PP2 respectively; a first production horizontal wellbore internal temperature-pressure integrated sensor P1, a second production horizontal wellbore internal temperature-pressure integrated sensor P2, a third production horizontal wellbore internal temperature-pressure integrated sensor P3, a fourth production horizontal wellbore internal temperature-pressure integrated sensor P4, a fifth production horizontal wellbore internal temperature-pressure integrated sensor P5 and a sixth production horizontal wellbore internal temperature-pressure integrated sensor P6 are series-connected by using the production horizontal wellbore internal temperature-pressure integrated sensor data collection lines MP2 according to a sequence of a length interval of the first simulation production well section J1, the second simulation production well section J2, the third simulation production well section J3, the fourth simulation production well section J4, the fifth simulation production well section J5 and the sixth simulation production well section J6; the series-connected first production horizontal wellbore internal temperature-pressure integrated sensor P1, second production horizontal wellbore internal temperature-pressure integrated sensor P2, third production horizontal wellbore internal temperature-pressure integrated sensor P3, fourth production horizontal wellbore internal temperature-pressure integrated sensor P4, fifth production horizontal wellbore internal temperature-pressure integrated sensor P5 and sixth production horizontal wellbore internal temperature-pressure integrated sensor P6 are fixedly placed inside the first simulation production well section J1, the second simulation production well section J2, the third simulation production well section J3, the fourth simulation production well section J4, the fifth simulation production well section J5 and the sixth simulation production well section J6; the first production horizontal wellbore external temperature-pressure-streaming potential integrated sensor S1, the second production horizontal wellbore external temperature-pressure-streaming potential integrated sensor S2, the third production horizontal wellbore external temperature-pressure-streaming potential integrated sensor S3, the fourth production horizontal wellbore external temperature-pressure-streaming potential integrated sensor S4, the fifth production horizontal wellbore external temperature-pressure-streaming potential integrated sensor S5 and the sixth production horizontal wellbore external temperature-pressure-streaming potential integrated sensor S6 are series-connected by using the production horizontal wellbore external temperature-pressure-streaming potential integrated sensor data collection lines MP1 according to the sequence of the length interval of the first simulation production well section J1, the second simulation production well section J2, the third simulation production well section J3, the fourth simulation production well section J4, the fifth simulation production well section J5 and the sixth simulation production well section J6; the series-connected first production horizontal wellbore external temperature-pressure-streaming potential integrated sensor S1, second production horizontal wellbore external temperature-pressure-streaming potential integrated sensor S2, third production horizontal wellbore external temperature-pressure-streaming potential integrated sensor S3, fourth production horizontal wellbore external temperature-pressure-streaming potential integrated sensor S4, fifth production horizontal wellbore external temperature-pressure-streaming potential integrated sensor S5 and sixth production horizontal wellbore external temperature-pressure-streaming potential integrated sensor S6 are attached to the outsides of the first simulation production well section J1, the second simulation production well section J2, the third simulation production well section J3, the fourth simulation production well section J4, the fifth simulation production well section J5 and the sixth simulation production well section J6; center lines of the first simulation production well section J1, the second simulation production well section J2, the third simulation production well section J3, the fourth simulation production well section J4, the fifth simulation production well section J5 and the sixth simulation production well section J6, the first production horizontal wellbore hydraulic decoder D1, the second production horizontal wellbore hydraulic decoder D2, the third production horizontal wellbore hydraulic decoder D3, the fourth production horizontal wellbore hydraulic decoder D4, the fifth production horizontal wellbore hydraulic decoder D5 and the sixth production horizontal wellbore hydraulic decoder D6, the first production horizontal wellbore external temperature-pressure-streaming potential integrated sensor S1, the second production horizontal wellbore external temperature-pressure-streaming potential integrated sensor S2, the third production horizontal wellbore external temperature-pressure-streaming potential integrated sensor S3, the fourth production horizontal wellbore external temperature-pressure-streaming potential integrated sensor S4, the fifth production horizontal wellbore external temperature-pressure-streaming potential integrated sensor S5 and the sixth production horizontal wellbore external temperature-pressure-streaming potential integrated sensor S6, the first production horizontal wellbore hydraulic decoder high-pressure integrated control pipeline A1, the second production horizontal wellbore hydraulic decoder high-pressure integrated control pipeline A2, the third production horizontal wellbore hydraulic decoder high-pressure integrated control pipeline A3, the fourth production horizontal wellbore hydraulic decoder high-pressure integrated control pipeline A4, the fifth production horizontal wellbore hydraulic decoder high-pressure integrated control pipeline A5 and the sixth production horizontal wellbore hydraulic decoder high-pressure integrated control pipeline A6, the production horizontal wellbore hydraulic decoder high-pressure power fluid integrated pipelines PP2, the production horizontal wellbore external temperature-pressure-streaming potential integrated sensor data collection lines MP1, and a first production horizontal wellbore flow control valve O1, a second production horizontal wellbore flow control valve O2, a third production horizontal wellbore flow control valve O3, a fourth production horizontal wellbore flow control valve O4, a fifth production horizontal wellbore flow control valve O5 and a sixth production horizontal wellbore flow control valve O6 are to be at the same horizontal line, to complete the assembly of a simulation production horizontal wellbore system WBP.

At step 3, the first injection horizontal wellbore flow control valve W1, the second injection horizontal wellbore flow control valve W2, the third injection horizontal wellbore flow control valve W3, the fourth injection horizontal wellbore flow control valve W4, the fifth injection horizontal wellbore flow control valve W5 and the sixth injection horizontal wellbore flow control valve W6 are sequentially assembled on the first simulation injection well section K1, the second simulation injection well section K2, the third simulation injection well section K3, the fourth simulation injection well section K4, the fifth simulation injection well section K5 and the sixth simulation injection well section K6; the first injection horizontal wellbore hydraulic decoder D7, the second injection horizontal wellbore hydraulic decoder D8, the third injection horizontal wellbore hydraulic decoder D9, the fourth injection horizontal wellbore hydraulic decoder D10, the fifth injection horizontal wellbore hydraulic decoder D11 and the sixth injection horizontal wellbore hydraulic decoder D12 are sequentially connected to the first injection horizontal wellbore flow control valve W1, the second injection horizontal wellbore flow control valve W2, the third injection horizontal wellbore flow control valve W3, the fourth injection horizontal wellbore flow control valve W4, the fifth injection horizontal wellbore flow control valve W5 and the sixth injection horizontal wellbore flow control valve W6, and attached to the outsides of the first simulation injection well section K1, the second simulation injection well section K2, the third simulation injection well section K3, the fourth simulation injection well section K4, the fifth simulation injection well section K5 and the sixth simulation injection well section K6; the first simulation injection well section K1, the second simulation injection well section K2, the third simulation injection well section K3, the fourth simulation injection well section K4, the fifth simulation injection well section K5 and the sixth simulation injection well section K6 are series-connected in sequence to form a simulation horizontal injection wellbore; three of the first injection horizontal wellbore hydraulic decoder high-pressure integrated control pipeline B1, the second injection horizontal wellbore hydraulic decoder high-pressure integrated control pipeline B2, the third injection horizontal wellbore hydraulic decoder high-pressure integrated control pipeline B3, the fourth injection horizontal wellbore hydraulic decoder high-pressure integrated control pipeline B4, the fifth injection horizontal wellbore hydraulic decoder high-pressure integrated control pipeline B5 and the sixth injection horizontal wellbore hydraulic decoder high-pressure integrated control pipeline B6 are connected to three of the injection horizontal wellbore hydraulic decoder high-pressure power fluid integrated pipelines PI2 respectively; a first injection horizontal wellbore internal temperature-pressure integrated sensor I1, a second injection horizontal wellbore internal temperature-pressure integrated sensor I2, a third injection horizontal wellbore internal temperature-pressure integrated sensor I3, a fourth injection horizontal wellbore internal temperature-pressure integrated sensor I4, a fifth injection horizontal wellbore internal temperature-pressure integrated sensor I5 and a sixth injection horizontal wellbore internal temperature-pressure integrated sensor I6 are series-connected by using the injection horizontal wellbore internal temperature-pressure integrated sensor data collection lines MI2 according to a sequence of a length interval of the first simulation injection well section K1, the second simulation injection well section K2, the third simulation injection well section K3, the fourth simulation injection well section K4, the fifth simulation injection well section K5 and the sixth simulation injection well section K6; the series-connected first injection horizontal wellbore internal temperature-pressure integrated sensor I1, second injection horizontal wellbore internal temperature-pressure integrated sensor I2, third injection horizontal wellbore internal temperature-pressure integrated sensor I3, fourth injection horizontal wellbore internal temperature-pressure integrated sensor I4, fifth injection horizontal wellbore internal temperature-pressure integrated sensor I5 and sixth injection horizontal wellbore internal temperature-pressure integrated sensor I6 are fixedly placed inside the first simulation injection well section K1, the second simulation injection well section K2, the third simulation injection well section K3, the fourth simulation injection well section K4, the fifth simulation injection well section K5 and the sixth simulation injection well section K6; the first injection horizontal wellbore external temperature-pressure-streaming potential integrated sensor E1, the second injection horizontal wellbore external temperature-pressure-streaming potential integrated sensor E2, the third injection horizontal wellbore external temperature-pressure-streaming potential integrated sensor E3, the fourth injection horizontal wellbore external temperature-pressure-streaming potential integrated sensor E4, the fifth injection horizontal wellbore external temperature-pressure-streaming potential integrated sensor E5 and the sixth injection horizontal wellbore external temperature-pressure-streaming potential integrated sensor E6 are series-connected by using the injection horizontal wellbore external temperature-pressure-streaming potential integrated sensor data collection lines MI1 according to the sequence of the length interval of the first simulation injection well section K1, the second simulation injection well section K2, the third simulation injection well section K3, the fourth simulation injection well section K4, the fifth simulation injection well section K5 and the sixth simulation injection well section K6; the series-connected first injection horizontal wellbore external temperature-pressure-streaming potential integrated sensor E1, second injection horizontal wellbore external temperature-pressure-streaming potential integrated sensor E2, third injection horizontal wellbore external temperature-pressure-streaming potential integrated sensor E3, fourth injection horizontal wellbore external temperature-pressure-streaming potential integrated sensor E4, fifth injection horizontal wellbore external temperature-pressure-streaming potential integrated sensor E5 and sixth injection horizontal wellbore external temperature-pressure-streaming potential integrated sensor E6 are attached to the outsides of the first simulation injection well section K1, the second simulation injection well section K2, the third simulation injection well section K3, the fourth simulation injection well section K4, the fifth simulation injection well section K5 and the sixth simulation injection well section K6; center lines of the first simulation injection well section K1, the second simulation injection well section K2, the third simulation injection well section K3, the fourth simulation injection well section K4, the fifth simulation injection well section K5 and the sixth simulation injection well section K6, the first injection horizontal wellbore hydraulic decoder D7, the second injection horizontal wellbore hydraulic decoder D8, the third injection horizontal wellbore hydraulic decoder D9, the fourth injection horizontal wellbore hydraulic decoder D10, the fifth injection horizontal wellbore hydraulic decoder D11 and the sixth injection horizontal wellbore hydraulic decoder D12, the first injection horizontal wellbore external temperature-pressure-streaming potential integrated sensor E1, the second injection horizontal wellbore external temperature-pressure-streaming potential integrated sensor E2, the third injection horizontal wellbore external temperature-pressure-streaming potential integrated sensor E3, the fourth injection horizontal wellbore external temperature-pressure-streaming potential integrated sensor E4, the fifth injection horizontal wellbore external temperature-pressure-streaming potential integrated sensor E5 and the sixth injection horizontal wellbore external temperature-pressure-streaming potential integrated sensor E6, the first injection horizontal wellbore hydraulic decoder high-pressure integrated control pipeline B1, the second injection horizontal wellbore hydraulic decoder high-pressure integrated control pipeline B2, the third injection horizontal wellbore hydraulic decoder high-pressure integrated control pipeline B3, the fourth injection horizontal wellbore hydraulic decoder high-pressure integrated control pipeline B4, the fifth injection horizontal wellbore hydraulic decoder high-pressure integrated control pipeline B5 and the sixth injection horizontal wellbore hydraulic decoder high-pressure integrated control pipeline B6, the injection horizontal wellbore hydraulic decoder high-pressure power fluid integrated pipeline PI2, the injection horizontal wellbore external temperature-pressure-streaming potential integrated sensor data collection line MI1, and the first injection horizontal wellbore flow control valve W1, the second injection horizontal wellbore flow control valve W2, the third injection horizontal wellbore flow control valve W3, the fourth injection horizontal wellbore flow control valve W4, the fifth injection horizontal wellbore flow control valve W5 and the sixth injection horizontal wellbore flow control valve W6 are to be at the same horizontal line, to complete the assembly of a simulation injection horizontal wellbore system WBI.

At step 4, the simulation production horizontal wellbore system WBP assembled at step 2, the simulation injection horizontal wellbore system WBI assembled at step 3, and the divided reservoir 3D-printed physical model RS printed at step 1 are assembled into a physical model with a reservoir and a wellbore coupled; the production horizontal wellbore external temperature-pressure-streaming potential integrated sensor data collection line MP1, the production horizontal wellbore internal temperature-pressure integrated sensor data collection line MP2, the injection horizontal wellbore external temperature-pressure-streaming potential integrated sensor data collection line MI1, the injection horizontal wellbore internal temperature-pressure integrated sensor data collection line MI2, the production horizontal wellbore hydraulic decoder high-pressure power fluid integrated pipeline PP2, the injection horizontal wellbore hydraulic decoder high-pressure power fluid integrated pipeline PI2, an injection horizontal wellbore high-pressure injection pipeline L2 and a production horizontal wellbore high-pressure outflow pipeline L4 are led out of the high-temperature and high-pressure closed rectangular reservoir simulation box BX through through-holes around the high-temperature and high-pressure closed rectangular reservoir simulation box BX; the assembled physical model with the coupled reservoir and wellbore is placed inside the high-temperature and high-pressure closed rectangular reservoir simulation box BX, and the periphery of the model is tightly bonded to an inner wall surface of the high-temperature and high-pressure closed rectangular reservoir simulation box BX by using a high temperature resistant gel; and a bottom cover and a top cover are firmly connected to the body of the high-temperature and high-pressure closed rectangular reservoir simulation box BX by bolts to form a sealed system.

At step 5, the production horizontal wellbore high-pressure outflow pipeline L4 is connected to the first simulation production well section J1 in the simulation production horizontal wellbore system WBP; one end of an electric automatically-adjusted back pressure valve V1 is connected to the production horizontal wellbore high-pressure outflow pipeline L4, and the other end of the electric automatically-adjusted back pressure valve V1 is connected to a fluid collection tank TP through a fluid collection tank fluid collection pipeline L3; the injection horizontal wellbore high-pressure injection pipeline L2 is connected to the first simulation injection well section K1 in the simulation injection horizontal wellbore system WBI; one end of an injection horizontal wellbore plunger pump X3 is connected to the injection horizontal wellbore high-pressure injection pipeline L2, and the other end of the injection horizontal wellbore plunger pump X3 is connected to a fluid supply tank TI through a fluid supply tank fluid discharge pipeline L1; and a production horizontal wellbore hydraulic decoder drive system X1 is connected to the production horizontal wellbore hydraulic decoder high-pressure power fluid integrated pipeline PP2 and to a high-pressure power fluid storage tank TL through a production horizontal wellbore high-pressure power fluid storage tank output pipeline PP1, and an injection horizontal wellbore hydraulic decoder drive system X2 is connected to the injection horizontal wellbore hydraulic decoder high-pressure power fluid integrated pipeline PI2 and to the high-pressure power fluid storage tank TL through an injection horizontal wellbore high-pressure power fluid storage tank output pipeline PI1.

At step 6, the production horizontal wellbore external temperature-pressure-streaming potential integrated sensor data collection line MP1, the production horizontal wellbore internal temperature-pressure integrated sensor data collection line MP2, the injection horizontal wellbore external temperature-pressure-streaming potential integrated sensor data collection line MI1, the injection horizontal wellbore internal temperature-pressure integrated sensor data collection line MI2, a back pressure valve control pipeline CV, a plunger pump control pipeline CW, a production end power fluid control pipeline CP and an injection end power fluid control pipeline CI are connected to a computer data collection and control system CS respectively.

At step 7, the high-temperature and high-pressure closed rectangular reservoir simulation box BX is vacuumized; and water saturation is performed for the reservoir 3D-printed physical model RS through the first simulation injection well section K1, the second simulation injection well section K2, the third simulation injection well section K3, the fourth simulation injection well section K4, the fifth simulation injection well section K5 and the sixth simulation injection well section K6 to record a volume of the water used for saturation.

At step 8, medium oil saturation is performed for the reservoir 3D-printed physical model RS through the first simulation injection well section K1, the second simulation injection well section K2, the third simulation injection well section K3, the fourth simulation injection well section K4, the fifth simulation injection well section K5 and the sixth simulation injection well section K6 to record a volume of the medium oil used for saturation.

At step 9, the computer data collection and control system CS is started to import the numerical model of the reservoir 3D-printed physical model RS built at step 1 into a reservoir development simulation automatic historical fitting software 2017SR115231; a total injection volume is set in a smart oilfield development and production optimization decision-making software 2016SR214413, and the opening degrees of the first injection horizontal wellbore flow control valve W1, the second injection horizontal wellbore flow control valve W2, the third injection horizontal wellbore flow control valve W3, the fourth injection horizontal wellbore flow control valve W4, the fifth injection horizontal wellbore flow control valve W5 and the sixth injection horizontal wellbore flow control valve W6 of the first simulation injection well section K1, the second simulation injection well section K2, the third simulation injection well section K3, the fourth simulation injection well section K4, the fifth simulation injection well section K5 and the sixth simulation injection well section K6 and the opening degrees of the first production horizontal wellbore flow control valve O1, the second production horizontal wellbore flow control valve O2, the third production horizontal wellbore flow control valve O3, the fourth production horizontal wellbore flow control valve O4, the fifth production horizontal wellbore flow control valve O5 and the sixth production horizontal wellbore flow control valve O6 of the first simulation production well section J1, the second simulation production well section J2, the third simulation production well section J3, the fourth simulation production well section J4, the fifth simulation production well section J5 and the sixth simulation production well section J6 are all set to full open at the same time, a back pressure value of the simulation horizontal production wellbore formed by series-connecting the first simulation production well section J1, the second simulation production well section J2, the third simulation production well section J3, the fourth simulation production well section J4, the fifth simulation production well section J5 and the sixth simulation production well section J6 is set and converted into instructions, and the instructions are sent to the injection horizontal wellbore plunger pump X3, the injection horizontal wellbore hydraulic decoder drive system X2, the production horizontal wellbore hydraulic decoder drive system X1 and the electric automatically-adjusted back pressure valve V1 respectively for start of the experiment.

At step 10, the computer data collection and control system CS collects temperature, pressure and streaming potential data outside the first simulation production well section J1, the second simulation production well section J2, the third simulation production well section J3, the fourth simulation production well section J4, the fifth simulation production well section J5 and the sixth simulation production well section J6, temperature and pressure data inside the first simulation production well section J1, the second simulation production well section J2, the third simulation production well section J3, the fourth simulation production well section J4, the fifth simulation production well section J5 and the sixth simulation production well section J6, temperature, pressure and streaming potential data outside the first simulation injection well section K1, the second simulation injection well section K2, the third simulation injection well section K3, the fourth simulation injection well section K4, the fifth simulation injection well section K5 and the sixth simulation injection well section K6, and temperature and pressure data inside the first simulation injection well section K1, the second simulation injection well section K2, the third simulation injection well section K3, the fourth simulation injection well section K4, the fifth simulation injection well section K5 and the sixth simulation injection well section K6 in real time through the production horizontal wellbore external temperature-pressure-streaming potential integrated sensor data collection line MP1, the production horizontal wellbore internal temperature-pressure integrated sensor data collection line MP2, the injection horizontal wellbore external temperature-pressure-streaming potential integrated sensor data collection line MI1 and the injection horizontal wellbore internal temperature-pressure integrated sensor data collection line MI2; a smart well long-term downhole pressure monitoring data processing and interpretation software 2016SR170270 extracts the above collected data at a certain time interval to obtain respective flows and water contents of the first simulation production well section J1, the second simulation production well section J2, the third simulation production well section J3, the fourth simulation production well section J4, the fifth simulation production well section J5 and the sixth simulation production well section J6 and water-drive front positions in the reservoir 3D-printed physical model RS and respective flows of the first simulation injection well section K1, the second simulation injection well section K2, the third simulation injection well section K3, the fourth simulation injection well section K4, the fifth simulation injection well section K5 and the sixth simulation injection well section K6 through calculation and analysis, and transmits the data to the reservoir development simulation automatic historical fitting software 2017SR115231 through a data interface.

At step 11, the reservoir development simulation automatic historical fitting software 2017SR115231 performs automatic historical fitting calculation based on a result calculated and analyzed in the smart well long-term downhole pressure monitoring data processing and interpretation software 2016SR170270 to obtain oil-water distribution and pressure field distribution in the reservoir 3D-printed physical model RS, and transmits the data to the smart oilfield development and production optimization decision-making software 2016SR214413 through the data interface.

At step 12, the smart oilfield development and production optimization decision-making software 2016SR214413 performs injection production optimization with a goal of maximizing a recovery rate based on the result calculated and analyzed in the reservoir development simulation automatic historical fitting software 2017SR115231 to obtain respective optimal adjustment flows of the first simulation production well section J1, the second simulation production well section J2, the third simulation production well section J3, the fourth simulation production well section J4, the fifth simulation production well section J5 and the sixth simulation production well section J6 and the first simulation injection well section K1, the second simulation injection well section K2, the third simulation injection well section K3, the fourth simulation injection well section K4, the fifth simulation injection well section K5 and sixth simulation injection well section K6 at the next time step; and the smart oilfield development and production optimization decision-making software 2016SR214413 converts the respective optimal adjustment flows at the next time step into instructions and send the instructions to the injection horizontal wellbore plunger pump X3, the injection horizontal wellbore hydraulic decoder drive system X2 and the production horizontal wellbore hydraulic decoder drive system X1 respectively, to start the next water-drive reservoir injection production adjustment period.

At step 13, steps 10-12 are repeated until a comprehensive water content of the simulation horizontal production wellbore formed by series-connecting the first simulation production well section J1, the second simulation production well section J2, the third simulation production well section J3, the fourth simulation production well section J4, the fifth simulation production well section J5 and the sixth simulation production well section J6 reaches 98%.

In an improvement, the simulation production wellbore formed by series-connecting the first simulation production well section J1, the second simulation production well section J2, the third simulation production well section J3, the fourth simulation production well section J4, the fifth simulation production well section J5 and the sixth simulation production well section J6, and the simulation injection wellbore formed by series-connecting the first simulation injection well section K1, the second simulation injection well section K2, the third simulation injection well section K3, the fourth simulation injection well section K4, the fifth simulation injection well section K5 and the sixth simulation injection well section K6 are placed in a vertical or inclined manner to simulate real-time optimization and adjustment of one-injection-one-production vertical well or inclined well injection production; or, the simulation production wellbore and the simulation injection wellbore may also be combined in a horizontal, vertical or inclined manner to simulate different well combinations of horizontal well and vertical well, horizontal well and inclined well, and vertical well and inclined well; the number of simulation production well sections may be 1, 2, 10, or any number of sections, with a minimum of one section, and the number of simulation injection well sections may be 1, 2, 10, or any number of sections, with a minimum of one section; the number of simulation production well sections and the number of simulation injection well sections may be identical or different; a displacement medium may be a polymer, chemical agent or gas; the reservoir 3D-printed physical model RS has heterogeneous longitudinal permeability, and includes at least two types of different permeabilities, or the reservoir 3D-printed physical model RS may have longitudinal and planar heterogeneous permeabilities at the same time; fracture and holes may be set in the reservoir 3D-printed physical model RS.

The invention claimed is:

1. A simulation experimental apparatus for real-time optimization and adjustment of smart oilfield injection production, comprising: a high-temperature and high-pressure closed rectangular reservoir simulation box, a reservoir 3D-printed physical model, a simulation production horizontal wellbore system, a simulation injection horizontal wellbore system, a fluid supply system, a fluid collection system, a power fluid system and a computer data collection and control system, wherein the reservoir 3D-printed physical model is placed in the high-temperature and high-pressure closed rectangular reservoir simulation box, the simulation production horizontal wellbore system and the simulation injection horizontal wellbore system are arranged at the left and right sides in the reservoir 3D-printed physical model respectively to simulate two horizontal wells, that is, one injection well and one production well; the fluid supply system injects a displacement fluid into the simulation injection horizontal wellbore system to displace a fluid in the reservoir 3D-printed physical model to flow to the simulation production horizontal wellbore system and enter the fluid collection system; the computer data collection and control system collects temperature, pressure and streaming potential data of different well sections of the simulation injection horizontal wellbore system and the simulation production horizontal wellbore system, calculates and analyzes the data to form an optimal injection production plan, and then sends instructions to the power fluid system to adjust injection and production volumes of different well sections of the simulation injection horizontal wellbore system and the simulation production horizontal wellbore system, wherein the simulation production horizontal wellbore system simulates sectioned production, monitoring and adjustment of a horizontal production well; the simulation production horizontal wellbore system is arranged at a side of the reservoir 3D-printed physical model, and formed by a plurality of simulation production well sections, a plurality of production horizontal wellbore flow control valves and a plurality of production horizontal wellbore hydraulic decoders; the simulation production horizontal wellbore system comprises a total of six series-connected simulation production well sections, that is, a first simulation production well section, a second simulation production well section, a third simulation production well section, a fourth simulation production well section, a fifth simulation production well section and a sixth simulation production well section; a total of six series-connected production horizontal wellbore flow control valves, that is, a first production horizontal wellbore flow control valve, a second production horizontal wellbore flow control valve, a third production horizontal wellbore flow control valve, a fourth production horizontal wellbore flow control valve, a fifth production horizontal wellbore flow control valve and a sixth production horizontal wellbore flow control valve; and a total of six series-connected production horizontal wellbore hydraulic decoders, that is, a first production horizontal wellbore hydraulic decoder, a second production horizontal wellbore hydraulic decoder, a third production horizontal wellbore hydraulic decoder, a fourth production horizontal wellbore hydraulic decoder, a fifth production horizontal wellbore hydraulic decoder and a sixth production horizontal wellbore hydraulic decoder; the number of simulation production well sections, the number of production horizontal wellbore flow control valves and the number of production horizontal wellbore hydraulic decoders are in one-to-one correspondence, and one simulation production well section, one production horizontal wellbore flow control valve and one production horizontal wellbore hydraulic decoder form one control unit to realize flow control of one production interval; there are at least two simulation production well sections in the plurality of simulation production well sections, at least two production horizontal wellbore flow control valves in the plurality of production horizontal wellbore flow control valves, and at least two production horizontal wellbore hydraulic decoders in the plurality of production horizontal wellbore hydraulic decoders; the first production horizontal wellbore hydraulic decoder, the second production horizontal wellbore hydraulic decoder, the third production horizontal wellbore hydraulic decoder, the fourth production horizontal wellbore hydraulic decoder, the fifth production horizontal wellbore hydraulic decoder and the sixth production horizontal wellbore hydraulic decoder are attached to outsides of the first simulation production well section, the second simulation production well section, the third simulation production well section, the fourth simulation production well section, the fifth simulation production well section and the sixth simulation production well section respectively, and connected to the first production horizontal wellbore flow control valve, the second production horizontal wellbore flow control valve, the third production horizontal wellbore flow control valve, the fourth production horizontal wellbore flow control valve, the fifth production horizontal wellbore flow control valve and the sixth production horizontal wellbore flow control valve respectively in a direct hydraulic manner; the first production horizontal wellbore hydraulic decoder, the second production horizontal wellbore hydraulic decoder, the third production horizontal wellbore hydraulic decoder, the fourth production horizontal wellbore hydraulic decoder, the fifth production horizontal wellbore hydraulic decoder and the sixth production horizontal wellbore hydraulic decoder are connected to production horizontal wellbore hydraulic decoder high-pressure power fluid integrated pipelines through a first production horizontal wellbore hydraulic decoder high-pressure integrated control pipeline, a second production horizontal wellbore hydraulic decoder high-pressure integrated control pipeline, a third production horizontal wellbore hydraulic decoder high-pressure integrated control pipeline, a fourth production horizontal wellbore hydraulic decoder high-pressure integrated control pipeline, a fifth production horizontal wellbore hydraulic decoder high-pressure integrated control pipeline and a sixth production horizontal wellbore hydraulic decoder high-pressure integrated control pipeline respectively; the first production horizontal wellbore internal temperature-pressure integrated sensor, the second production horizontal wellbore internal temperature-pressure integrated sensor, the third production horizontal wellbore internal temperature-pressure integrated sensor, the fourth production horizontal wellbore internal temperature-pressure integrated sensor, the fifth production horizontal wellbore internal temperature-pressure integrated sensor and the sixth production horizontal wellbore internal temperature-pressure integrated sensor are arranged inside the first simulation production well section, the second simulation production well section, the third simulation production well section, the fourth simulation production well section, the fifth simulation production well section and the sixth simulation production well section respectively, series-connected through production horizontal wellbore internal temperature-pressure integrated sensor data collection lines, and connected to the computer data collection and control system; the first production horizontal wellbore external temperature-pressure-streaming potential integrated sensor, the second production horizontal wellbore external temperature-pressure-streaming potential integrated sensor, the third production horizontal wellbore external temperature-pressure-streaming potential integrated sensor, the fourth production horizontal wellbore external temperature-pressure-streaming potential integrated sensor, the fifth production horizontal wellbore external temperature-pressure-streaming potential integrated sensor and the sixth production horizontal wellbore external temperature-pressure-streaming potential integrated sensor are arranged at outsides of the first simulation production well section, the second simulation production well section, the third simulation production well section, the fourth simulation production well section, the fifth simulation production well section and the sixth simulation production well section respectively, series-connected through production horizontal wellbore external temperature-pressure-streaming potential integrated sensor data collection lines, and connected to the computer data collection and control system.

2. The simulation experimental apparatus for real-time optimization and adjustment of smart oilfield injection production according to claim 1, wherein
the high-temperature and high-pressure closed rectangular reservoir simulation box is a closed hollow rectangular box body with an internal space providing a storage place for the reservoir 3D-printed physical model;
the reservoir 3D-printed physical model is placed in the high-temperature and high-pressure closed rectangular reservoir simulation box to simulate different reservoir types; the reservoir 3D-printed physical model is a homogeneous reservoir 3D-printed physical model or a heterogeneous reservoir 3D-printed physical model; the homogeneous reservoir 3D-printed physical model is an integrally-printed 3D-printed physical model having both same planar permeability and same longitudinal permeability; the heterogeneous reservoir 3D-printed physical model is obtained by integrally printing a first reservoir 3D-printed physical model, a second reservoir 3D-printed physical model and a third reservoir 3D-printed physical model with different permeabilities; the heterogeneous reservoir 3D-printed physical model is a 3D-printed physical model with heterogeneous planar permeability, heterogeneous longitudinal permeability, or with both heterogeneous planar permeability and heterogeneous longitudinal permeability; the heterogeneous reservoir 3D-printed physical model has at least two types of different permeabilities; fractures and holes are disposed in the heterogeneous reservoir 3D-printed physical model.

3. The simulation experimental apparatus for real-time optimization and adjustment of smart oilfield injection production according to claim 1, wherein
the simulation injection horizontal wellbore system simulates the sectioned production, monitoring and adjustment of a horizontal injection well; the simulation injection horizontal wellbore system is formed by a plurality of simulation injection well sections, a plurality of injection horizontal wellbore flow control valves and a plurality of injection horizontal wellbore hydraulic decoders; the simulation injection horizontal wellbore system comprises a total of six series-connected simulation injection well sections, that is, a first simulation injection well section, a second simulation injection well section, a third simulation injection well section, a fourth simulation injection well section, a fifth simulation injection well section and a sixth simulation injection well section; a total of six series-connected injection horizontal wellbore flow control valves, that is, a first injection horizontal wellbore flow control valve, a second injection horizontal wellbore flow control valve, a third injection horizontal wellbore flow control valve, a fourth injection horizontal wellbore flow control valve, a fifth injection horizontal wellbore flow control valve and a sixth injection horizontal wellbore flow control valve; and a total of six series-connected injection horizontal wellbore hydraulic decoders, that is, a first injection horizontal wellbore hydraulic decoder, a second injection horizontal wellbore hydraulic decoder, a third injection horizontal wellbore hydraulic decoder, a fourth injection horizontal wellbore hydraulic decoder, a fifth injection horizontal wellbore hydraulic decoder and a sixth injection horizontal wellbore hydraulic decoder; the number of simulation injection well sections, the number of injection horizontal wellbore flow control valves and the number of injection horizontal wellbore hydraulic decoders are in one-to-one correspondence, and one simulation injection well section, one injection horizontal wellbore flow control valve and one injection horizontal wellbore hydraulic decoder form one control unit to realize flow control of one injection interval; there are at least two simulation injection well sections in the plurality of simulation injection well sections, at least two injection horizontal wellbore flow control valves in the plurality of injection horizontal wellbore flow control valves, and at least two injection horizontal wellbore hydraulic decoders in the plurality of injection horizontal wellbore hydraulic decoders; the first injection horizontal wellbore hydraulic decoder, the second injection horizontal wellbore hydraulic decoder, the third injection horizontal wellbore hydraulic decoder, the fourth injection horizontal wellbore hydraulic decoder, the fifth injection horizontal wellbore hydraulic decoder and the sixth injection horizontal wellbore hydraulic decoder are attached to outsides of the first simulation injection well section, the second simulation injection well section, the third simulation injection well section, the fourth simulation injection well section, the fifth simulation injection well section and the sixth simulation injection well section respectively, and connected to the first injection horizontal wellbore flow control valve, the second injection horizontal wellbore flow control valve, the third injection horizontal wellbore flow control valve, the fourth injection horizontal wellbore flow control valve, the fifth injection horizontal wellbore flow control valve and the sixth injection horizontal wellbore flow control valve respectively in a direct hydraulic manner; the first injection horizontal wellbore hydraulic decoder, the second injection horizontal wellbore hydraulic decoder, the third injection horizontal wellbore hydraulic decoder, the fourth injection horizontal wellbore hydraulic decoder, the fifth injection horizontal wellbore hydraulic decoder and the sixth injection horizontal wellbore hydraulic decoder are connected to injection horizontal wellbore hydraulic decoder high-pressure power fluid integrated pipelines through a first injection horizontal wellbore hydraulic decoder high-pressure integrated control pipeline, a second injection horizontal wellbore hydraulic decoder high-pressure integrated control pipeline, a third injection horizontal wellbore hydraulic decoder high-pressure integrated control pipeline, a fourth injection horizontal wellbore hydraulic decoder high-pressure integrated control pipeline, a fifth injection horizontal wellbore hydraulic decoder high-pressure integrated control pipeline and a sixth injection horizontal wellbore hydraulic decoder high-pressure integrated control pipeline respectively; the first injection horizontal wellbore internal temperature-pressure integrated sensor, the second injection horizontal wellbore internal temperature-pressure integrated sensor, the third injection horizontal wellbore internal temperature-pressure integrated sensor, the fourth injection horizontal wellbore internal temperature-pressure integrated sensor, the fifth injection horizontal wellbore internal temperature-pressure integrated sensor and the sixth injection horizontal wellbore internal temperature-pressure integrated sensor are arranged at inside the first simulation injection well section, the second simulation injection well section, the third simulation injection well section, the fourth simulation injection well section, the fifth simulation injection well section and the sixth simulation injection well section respectively, series-connected through injection horizontal wellbore internal temperature-pressure integrated sensor data collection lines, and connected to the computer data collection and control system; the first injection horizontal wellbore external temperature-pressure-streaming potential integrated sensor, the second injection horizontal wellbore external temperature-pressure-streaming potential integrated sensor, the third injection horizontal wellbore external temperature-pressure-streaming potential integrated sensor, the fourth injection horizontal wellbore external temperature-pressure-streaming potential integrated sensor, the fifth injection horizontal wellbore external temperature-pressure-streaming potential integrated sensor and the sixth injection horizontal wellbore external temperature-pressure-streaming potential integrated sensor are arranged at the outsides of the first simulation injection well section, the second simulation injection well section, the third simulation injection well section, the fourth simulation injection well section, the fifth simulation injection well section and the sixth simulation injection well section respectively, series-connected through injection horizontal wellbore external temperature-pressure-streaming potential integrated sensor data collection lines, and connected to the computer data collection and control system;

according to an arrangement of the simulation production horizontal wellbore system and the simulation injection horizontal wellbore system in the reservoir 3D-printed physical model, when modeling is performed for the reservoir 3D-printed physical model on a computer, the physical model is divided into a plurality of numerical models with the wellbore of the simulation production horizontal wellbore system and the wellbore of the simulation injection horizontal wellbore system taken as a symmetrical axis respectively, and then, a plurality of the divided numerical models are printed respectively; there are at least two numerical models in the plurality of numerical models; the number of the divided physical models printed by using a 3D printer corresponds to the number of numerical models; all of the divided physical models printed by using the 3D printer are combined into a complete reservoir 3D-printed physical model.

4. The simulation experimental apparatus for real-time optimization and adjustment of smart oilfield injection production according to claim 1, wherein
the simulation production horizontal wellbore system discharges the fluid produced from the reservoir 3D-printed physical model into the fluid collection system, and the simulation injection horizontal wellbore system injects an injection fluid of the fluid supply system into the reservoir 3D-printed physical model; the simulation production horizontal wellbore system is connected to the fluid collection system through a production horizontal wellbore high-pressure outflow pipeline, and the simulation injection horizontal wellbore system is arranged at the other side of the reservoir 3D-printed physical model and connected to the fluid supply system through an injection horizontal wellbore high-pressure injection pipeline; the computer data collection and control system is connected to the power fluid system through a production end power fluid control pipeline and an injection end power fluid control pipeline respectively, and the power fluid system is connected to the simulation production horizontal wellbore system and the simulation injection horizontal wellbore system through the production horizontal wellbore hydraulic decoder high-pressure power fluid integrated pipeline and the injection horizontal wellbore hydraulic decoder high-pressure power fluid integrated pipeline respectively;
a plurality of through-holes for the production horizontal wellbore high-pressure outflow pipeline, the injection horizontal wellbore high-pressure injection pipeline, the production horizontal wellbore external temperature-pressure-streaming potential integrated sensor data collection line, the production horizontal wellbore internal temperature-pressure integrated sensor data collection line, the injection horizontal wellbore external temperature-pressure-streaming potential integrated sensor data collection line, the injection horizontal wellbore internal temperature-pressure integrated sensor data collection line, the production horizontal wellbore hydraulic decoder high-pressure power fluid integrated pipeline, and the injection horizontal wellbore hydraulic decoder high-pressure power fluid integrated pipeline to enter and exit the high-temperature and high-pressure closed rectangular reservoir simulation box are uniformly arranged around the hollow rectangular box body; there are at least 8 through-holes in the plurality of through-holes;
the divided physical model printed by using the 3D printer closely cooperates with the simulation production horizontal wellbore system and the simulation injection horizontal wellbore system to form a physical model with a reservoir and a wellbore coupled;
the physical model with the coupled reservoir and wellbore is placed inside the high-temperature and high-pressure closed rectangular reservoir simulation box; a bottom cover and a top cover of the high-temperature and high-pressure closed rectangular reservoir simulation box are connected to the hollow rectangular box body by bolts, and the physical model with the coupled reservoir and wellbore is sealed up in the high-temperature and high-pressure closed rectangular reservoir simulation box; the physical model with the coupled reservoir and wellbore is tightly bonded at an inner wall surface of the high-temperature and high-pressure closed rectangular reservoir simulation box by using a high temperature resistant gel;

center lines of the first simulation production well section, the second simulation production well section, the third simulation production well section, the fourth simulation production well section, the fifth simulation production well section and the sixth simulation production well section, the first production horizontal wellbore hydraulic decoder, the second production horizontal wellbore hydraulic decoder, the third production horizontal wellbore hydraulic decoder, the fourth production horizontal wellbore hydraulic decoder, the fifth production horizontal wellbore hydraulic decoder and the sixth production horizontal wellbore hydraulic decoder, the first production horizontal wellbore external temperature-pressure-streaming potential integrated sensor, the second production horizontal wellbore external temperature-pressure-streaming potential integrated sensor, the third production horizontal wellbore external temperature-pressure-streaming potential integrated sensor, the fourth production horizontal wellbore external temperature-pressure-streaming potential integrated sensor, the fifth production horizontal wellbore external temperature-pressure-streaming potential integrated sensor and the sixth production horizontal wellbore external temperature-pressure-streaming potential integrated sensor, the first production horizontal wellbore hydraulic decoder high-pressure integrated control pipeline, the second production horizontal wellbore hydraulic decoder high-pressure integrated control pipeline, the third production horizontal wellbore hydraulic decoder high-pressure integrated control pipeline, the fourth production horizontal wellbore hydraulic decoder high-pressure integrated control pipeline, the fifth production horizontal wellbore hydraulic decoder high-pressure integrated control pipeline and the sixth production horizontal wellbore hydraulic decoder high-pressure integrated control pipeline, the production horizontal wellbore hydraulic decoder high-pressure power fluid integrated pipelines, the production horizontal wellbore external temperature-pressure-streaming potential integrated sensor data collection lines, and the first production horizontal wellbore flow control valve, the second production horizontal wellbore flow control valve, the third production horizontal wellbore flow control valve, the fourth production horizontal wellbore flow control valve, the fifth production horizontal wellbore flow control valve and the sixth production horizontal wellbore flow control valve are at the same horizontal position.

5. The simulation experimental apparatus for real-time optimization and adjustment of smart oilfield injection production according to claim 1, wherein
center lines of the first simulation injection well section, the second simulation injection well section, the third simulation injection well section, the fourth simulation injection well section, the fifth simulation injection well section and the sixth simulation injection well section, the first injection horizontal wellbore hydraulic decoder, the second injection horizontal wellbore hydraulic decoder, the third injection horizontal wellbore hydraulic decoder, the fourth injection horizontal wellbore hydraulic decoder, the fifth injection horizontal wellbore hydraulic decoder and the sixth injection horizontal wellbore hydraulic decoder, the first injection horizontal wellbore external temperature-pressure-streaming potential integrated sensor, the second injection horizontal wellbore external temperature-pressurestreaming potential integrated sensor, the third injection horizontal wellbore external temperature-pressure-streaming potential integrated sensor, the fourth injection horizontal wellbore external temperature-pressure-streaming potential integrated sensor, the fifth injection horizontal wellbore external temperature-pressure-streaming potential integrated sensor and the sixth injection horizontal wellbore external temperature-pressure-streaming potential integrated sensor, the first injection horizontal wellbore hydraulic decoder high-pressure integrated control pipeline, the second injection horizontal wellbore hydraulic decoder high-pressure integrated control pipeline, the third injection horizontal wellbore hydraulic decoder high-pressure integrated control pipeline, the fourth injection horizontal wellbore hydraulic decoder high-pressure integrated control pipeline, the fifth injection horizontal wellbore hydraulic decoder high-pressure integrated control pipeline and the sixth injection horizontal wellbore hydraulic decoder high-pressure integrated control pipeline, the injection horizontal wellbore hydraulic decoder high-pressure power fluid integrated pipeline, the injection horizontal wellbore external temperature-pressure-streaming potential integrated sensor data collection line, and the first injection horizontal wellbore flow control valve, the second injection horizontal wellbore flow control valve, the third injection horizontal wellbore flow control valve, the fourth injection horizontal wellbore flow control valve, the fifth injection horizontal wellbore flow control valve and the sixth injection horizontal wellbore flow control valve are at the same horizontal position;

well types of the simulation production wellbore and the simulation injection wellbore arranged in the reservoir 3D-printed physical model comprise a horizontal well, a vertical well and an inclined well, or a combination thereof; the simulation production wellbore and the simulation injection wellbore arranged in the reservoir 3D-printed physical model may be at the same plane or at different planes;

the fluid supply system provides the injection fluid for the reservoir 3D-printed physical model through the simulation injection horizontal wellbore system and comprises a fluid supply tank and an injection horizontal wellbore plunger pump, the fluid supply tank is connected to the injection horizontal wellbore plunger pump through a fluid supply tank fluid discharge pipeline, and the injection horizontal wellbore plunger pump is connected to the first simulation injection well section of the simulation injection horizontal wellbore system through the injection horizontal wellbore high-pressure injection pipeline; the injection fluid in the fluid supply tank is pressurized by using the injection horizontal wellbore plunger pump and then enters the simulation injection horizontal wellbore system from the first simulation injection well section; the injection horizontal wellbore plunger pump is connected to the computer data collection and control system through a plunger pump control pipeline to receive a signal transmitted by the computer data collection and control system and automatically adjust a flow of the injection horizontal wellbore plunger pump.

6. The simulation experimental apparatus for real-time optimization and adjustment of smart oilfield injection production according to claim 1, wherein the fluid collection system collects the fluid produced from the reservoir 3D-printed physical model through the simulation production horizontal wellbore system and controls a back pressure of the simulation production horizontal wellbore system, and comprises a fluid collection tank and an electric automatically-adjusted back pressure valve; the fluid collection tank is connected to the electric automatically-adjusted back pressure valve through a fluid collection tank fluid collection pipeline, and the electric automatically-adjusted back pressure valve is connected to the first simulation production well section of the simulation production horizontal wellbore system through the production horizontal wellbore high-pressure outflow pipeline; an output fluid flowing out of the simulation production horizontal wellbore system sequentially flows through the production horizontal wellbore high-pressure outflow pipeline and the fluid collection tank fluid collection pipeline under the back pressure applied by the electric automatically-adjusted back pressure valve and enters the fluid collection tank; the electric automatically-adjusted back pressure valve is connected to the computer data collection and control system through a back pressure valve control pipeline to receive a signal transmitted by the computer data collection and control system, and automatically adjusts the back pressure acting on the simulation production horizontal wellbore system;

the power fluid system provides power for flow adjustment of different well sections in the simulation production horizontal wellbore system and the simulation injection horizontal wellbore system, and comprises a production horizontal wellbore hydraulic decoder drive system, an injection horizontal wellbore hydraulic decoder drive system and a high-pressure power fluid storage tank; the production horizontal wellbore hydraulic decoder drive system is connected to the high-pressure power fluid storage tank through a production horizontal wellbore high-pressure power fluid storage tank output pipeline, connected to the computer data collection and control system through the production end power fluid control pipeline, and connected to the simulation production horizontal wellbore system through the production horizontal wellbore hydraulic decoder high-pressure power fluid integrated pipeline; the injection horizontal wellbore hydraulic decoder drive system is connected to the high-pressure power fluid storage tank through an injection horizontal wellbore high-pressure power fluid storage tank output pipeline P, connected to the computer data collection and control system through the injection end power fluid control pipeline, and connected to the simulation injection horizontal wellbore system through the injection horizontal wellbore hydraulic decoder high-pressure power fluid integrated pipeline; the production horizontal wellbore hydraulic decoder high-pressure power fluid integrated pipeline comprises three high-pressure fluid control pipelines connected to three respective high-pressure fluid control pipelines in the first production horizontal wellbore hydraulic decoder high-pressure integrated control pipeline, the second production horizontal wellbore hydraulic decoder high-pressure integrated control pipeline, the third production horizontal wellbore hydraulic decoder high-pressure integrated control pipeline, the fourth production horizontal wellbore hydraulic decoder high-pressure integrated control pipeline, the fifth production horizontal wellbore hydraulic decoder high-pressure integrated control pipeline and the sixth production horizontal wellbore hydraulic decoder high-pressure integrated control pipeline respectively, to, by use of different sequences of applying pressures to three high-pressure fluid control pipelines, realize control of the first production horizontal wellbore hydraulic decoder, the second production horizontal wellbore hydraulic decoder, the third production horizontal wellbore hydraulic decoder, the fourth production horizontal wellbore hydraulic decoder, the fifth production horizontal wellbore hydraulic decoder and the sixth production horizontal wellbore hydraulic decoder.

7. The simulation experimental apparatus for real-time optimization and adjustment of smart oilfield injection production according to claim 1, wherein the injection horizontal wellbore hydraulic decoder high-pressure power fluid integrated pipeline comprises three high-pressure fluid control pipelines connected to three respective high-pressure fluid control pipelines in the first injection horizontal wellbore hydraulic decoder high-pressure integrated control pipeline, the second injection horizontal wellbore hydraulic decoder high-pressure integrated control pipeline, the third injection horizontal wellbore hydraulic decoder high-pressure integrated control pipeline, the fourth injection horizontal wellbore hydraulic decoder high-pressure integrated control pipeline, the fifth injection horizontal wellbore hydraulic decoder high-pressure integrated control pipeline and the sixth injection horizontal wellbore hydraulic decoder high-pressure integrated control pipeline respectively, to, by use of different sequences of applying pressures to three high-pressure fluid control pipelines, realize control of the first injection horizontal wellbore hydraulic decoder, the second injection horizontal wellbore hydraulic decoder, the third injection horizontal wellbore hydraulic decoder, the fourth injection horizontal wellbore hydraulic decoder, the fifth injection horizontal wellbore hydraulic decoder and the sixth injection horizontal wellbore hydraulic decoder;

the computer data collection and control system collects temperature, pressure and streaming potential data of the simulation production horizontal wellbore system and the simulation injection horizontal wellbore system, performs flow and reservoir parameter interpretation with a built-in monitoring data processing and interpretation software, and then obtains current pressure and saturation distribution in the reservoir model with a built-in automatic historical fitting software and a built-in production optimization decision-making software and generates an optimal injection production plan, and finally sends control instructions to the power fluid system to control production of the simulation production horizontal wellbore system and the simulation injection horizontal wellbore system;

the computer data collection and control system collects temperature, pressure and streaming potential data outside the first simulation production well section, the second simulation production well section, the third simulation production well section, the fourth simulation production well section, the fifth simulation production well section and the sixth simulation production well section and temperature and pressure data inside the first simulation production well section, the second simulation production well section, the third simulation production well section, the fourth simulation production well section, the fifth simulation production well section and the sixth simulation production well section through production horizontal wellbore external temperature-pressure-streaming potential integrated sensor data collection lines and production horizontal wellbore internal temperature-pressure integrated sensor data collection lines respectively, and collects temperature, pressure and streaming potential data outside the first simulation injection well section, the second simulation injection well section, the third simulation injection well section, the fourth simulation injection well section, the fifth simulation injection well section and the sixth simulation injection well section and temperature and pressure data inside the first simulation injection well section, the second simulation injection well section, the third simulation injection well section, the fourth simulation injection well section, the fifth simulation injection well section and the sixth simulation injection well section through injection horizontal wellbore external temperature-pressure-streaming potential integrated sensor data collection lines and injection horizontal wellbore internal temperature-pressure integrated sensor data collection lines respectively; the computer data collection and control system sends instructions to the electric automatically-adjusted back pressure valve through the back pressure valve control pipeline to control an opening degree of the electric automatically-adjusted back pressure valve and adjust the back pressure of the simulation production horizontal wellbore system; sends instructions to the injection horizontal wellbore plunger pump through the plunger pump control pipeline to control working parameters of the injection horizontal wellbore plunger pump and adjust the injected flow of the simulation injection horizontal wellbore system; sends instructions to the injection horizontal wellbore hydraulic decoder drive system through the injection end power fluid control pipeline to realize control of the first injection horizontal wellbore flow control valve, the second injection horizontal wellbore flow control valve, the third injection horizontal wellbore flow control valve, the fourth injection horizontal wellbore flow control valve, the fifth injection horizontal wellbore flow control valve and the sixth injection horizontal wellbore flow control valve by use of a sequence of applying the pressure to the first injection horizontal wellbore hydraulic decoder, the second injection horizontal wellbore hydraulic decoder, the third injection horizontal wellbore hydraulic decoder, the fourth injection horizontal wellbore hydraulic decoder, the fifth injection horizontal wellbore hydraulic decoder and the sixth injection horizontal wellbore hydraulic decoder through the injection horizontal wellbore hydraulic decoder high-pressure power fluid integrated pipeline by the injection horizontal wellbore hydraulic decoder drive system, so as to adjust the flow of the first simulation injection well section, the second simulation injection well section, the third simulation injection well section, the fourth simulation injection well section, the fifth simulation injection well section and the sixth simulation injection well section; and sends instructions to the production horizontal wellbore hydraulic decoder drive system through the production end power fluid control pipeline to realize control of the first production horizontal wellbore flow control valve, the second production horizontal wellbore flow control valve, the third production horizontal wellbore flow control valve, the fourth production horizontal wellbore flow control valve, the fifth production horizontal wellbore flow control valve and the sixth production horizontal wellbore flow control valve by use of a sequence of applying the pressure to the first production horizontal wellbore hydraulic decoder, the second production horizontal wellbore hydraulic decoder, the third production horizontal wellbore hydraulic decoder, the fourth production horizontal wellbore hydraulic decoder, the fifth production horizontal wellbore hydraulic decoder and the sixth production horizontal wellbore hydraulic decoder through the production horizontal wellbore hydraulic decoder high-pressure power fluid integrated pipeline by the production horizontal wellbore hydraulic decoder drive system, so as to adjust the flow of the first simulation production well section, the second simulation production well section, the third simulation production well section, the fourth simulation production well section, the fifth simulation production well section and the sixth simulation production well section;

the computer data collection and control system has a built-in smart well long-term downhole pressure monitoring data processing and interpretation software, a built-in reservoir development simulation automatic historical fitting software and a built-in smart oilfield development and production optimization decision-making software, which have been given software copyright;

the smart well long-term downhole pressure monitoring data processing and interpretation software performs comprehensive analysis for the temperature, pressure and streaming potential data outside the first simulation production well section, the second simulation production well section, the third simulation production well section, the fourth simulation production well section, the fifth simulation production well section and the sixth simulation production well section and the temperature and pressure data inside the first simulation production well section, the second simulation production well section, the third simulation production well section, the fourth simulation production well section, the fifth simulation production well section and the sixth simulation production well section collected respectively at a certain time interval through the production horizontal wellbore external temperature-pressure-streaming potential integrated sensor data collection line and the production horizontal wellbore internal temperature-pressure integrated sensor data collection line to obtain the respective flows and water contents of the first simulation production well section, the second simulation production well section, the third simulation production well section, the fourth simulation production well section, the fifth simulation production well section and the sixth simulation production well section and water-drive front positions in the reservoir 3D-printed physical model; and performs comprehensive analysis for the temperature, pressure and streaming potential data outside the first simulation injection well section, the second simulation injection well section, the third simulation injection well section, the fourth simulation injection well section, the fifth simulation injection well section and the sixth simulation injection well section and the temperature and pressure data inside the first simulation injection well section, the second simulation injection well section, the third simulation injection well section, the fourth simulation injection well section, the fifth simulation injection well section and the sixth simulation injection well section collected respectively at a certain time interval through the injection horizontal wellbore external temperature-pressure-streaming potential integrated sensor data collection line and the injection horizontal wellbore internal temperature-pressure integrated sensor data collection line, to obtain the respective flows of the first simulation injection well section, the second simulation injection well section, the third simulation injection well section, the fourth simulation injection well section, the fifth simulation injection well section and the sixth simulation injection well section;

the certain time interval is 10 seconds, 30 seconds, 60 seconds, 120 seconds, 300 seconds, or any number of seconds;

the reservoir development simulation automatic historical fitting software builds a reservoir numerical simulation model with the reservoir 3D-printed physical model to perform automatic historical fitting of the reservoir based on the respective flows and water contents of the first simulation production well section, the second simulation production well section, the third simulation production well section, the fourth simulation production well section, the fifth simulation production well section and the sixth simulation production well section and water-drive front positions in the reservoir 3D-printed physical model and the respective flows of the first simulation injection well section, the second simulation injection well section, the third simulation injection well section, the fourth simulation injection well section, the fifth simulation injection well section and the sixth simulation injection well section, which are interpreted by the smart well long-term downhole pressure monitoring data processing and interpretation software, so as to obtain oil-water saturation field distribution in the reservoir 3D-printed physical model in the current state;

the smart oilfield development and production optimization decision-making software performs injection-production production optimization with a goal of maximizing a recovery rate based on the oil-water saturation field distribution in the reservoir 3D-printed physical model in the current state obtained by the reservoir development simulation automatic historical fitting software, to obtain respective optimal flow parameters of the first simulation production well section, the second simulation production well section, the third simulation production well section, the fourth simulation production well section, the fifth simulation production well section and the sixth simulation production well section and the first simulation injection well section, the second simulation injection well section, the third simulation injection well section, the fourth simulation injection well section, the fifth simulation injection well section and sixth simulation injection well section;

the computer data collection and control system sends instructions of the respective optimal flow parameters of the first simulation production well section, the second simulation production well section, the third simulation production well section, the fourth simulation production well section, the fifth simulation production well section and the sixth simulation production well section obtained by the smart oilfield development and production optimization decision-making software to the production horizontal wellbore hydraulic decoder drive system through the production end power fluid control pipeline, to realize automatic adjustment of the respective flows of the first simulation production well section, the second simulation production well section, the third simulation production well section, the fourth simulation production well section, the fifth simulation production well section and the sixth simulation production well section;

the computer data collection and control system sends instructions of the respective optimal flow parameters of the first simulation injection well section, the second simulation injection well section, the third simulation injection well section, the fourth simulation injection well section, the fifth simulation injection well section and the sixth simulation injection well section obtained by the smart oilfield development and production optimization decision-making software to the injection horizontal wellbore hydraulic decoder drive system through the injection end power fluid control pipeline, to realize automatic adjustment of the respective flows of the first simulation injection well section, the second simulation injection well section, the third simulation injection well section, the fourth simulation injection well section, the fifth simulation injection well section and the sixth simulation injection well section.

8. A simulation experimental method for real-time optimization and adjustment of smart oilfield injection production using the simulation experimental apparatus for real-time optimization and adjustment of smart oilfield injection production according to claim 1, comprising the following steps:

at step 1, designing three planar heterogeneous reservoir models of different permeability regions according to simulation experimental requirements; building a physical model and a numerical model of a reservoir 3D-printed physical model according to outer diameters of a first simulation production well section, a second simulation production well section, a third simulation production well section, a fourth simulation production well section, a fifth simulation production well section and a sixth simulation production well section, outer diameters of a first simulation injection well section, a second simulation injection well section, a third simulation injection well section, a fourth simulation injection well section, a fifth simulation injection well section and a sixth simulation injection well section, outer diameters of a first injection horizontal wellbore hydraulic decoder, a second injection horizontal wellbore hydraulic decoder, a third injection horizontal wellbore hydraulic decoder, a fourth injection horizontal wellbore hydraulic decoder, a fifth injection horizontal wellbore hydraulic decoder and a sixth injection horizontal wellbore hydraulic decoder, outer diameters of a first production horizontal wellbore hydraulic decoder, a second production horizontal wellbore hydraulic decoder, a third production horizontal wellbore hydraulic decoder, a fourth production horizontal wellbore hydraulic decoder, a fifth production horizontal wellbore hydraulic decoder and a sixth production horizontal wellbore hydraulic decoder, outer diameters of a first production horizontal wellbore external temperature-pressure-streaming potential integrated sensor, a second production horizontal wellbore external temperature-pressure-streaming potential integrated sensor, a third production horizontal wellbore external temperature-pressure-streaming potential integrated sensor, a fourth production horizontal wellbore external temperature-pressure-streaming potential integrated sensor, a fifth production horizontal wellbore external temperature-pressure-streaming potential integrated sensor and a sixth production horizontal wellbore external temperature-pressure-streaming potential integrated sensor, outer diameters of a first injection horizontal wellbore external temperature-pressure-streaming potential integrated sensor, a second injection horizontal wellbore external temperature-pressure-streaming potential integrated sensor, a third injection horizontal wellbore external temperature-pressure-streaming potential integrated sensor, a fourth injection horizontal wellbore external temperature-pressure-streaming potential integrated sensor, a fifth injection horizontal wellbore external temperature-pressure-streaming potential integrated sensor and a sixth injection horizontal wellbore external temperature-pressure-streaming potential integrated sensor, outer diameters of a first production horizontal wellbore hydraulic decoder high-pressure integrated control pipeline, a second production horizontal wellbore hydraulic decoder high-pressure integrated control pipeline, a third production horizontal wellbore hydraulic decoder high-pressure integrated control pipeline, a fourth production horizontal wellbore hydraulic decoder high-pressure integrated control pipeline, a fifth production horizontal wellbore hydraulic decoder high-pressure integrated control pipeline and a sixth production horizontal wellbore hydraulic decoder high-pressure integrated control pipeline, outer diameters of a first injection horizontal wellbore hydraulic decoder high-pressure integrated control pipeline, a second injection horizontal wellbore hydraulic decoder high-pressure integrated control pipeline, a third injection horizontal wellbore hydraulic decoder high-pressure integrated control pipeline, a fourth injection horizontal wellbore hydraulic decoder high-pressure integrated control pipeline, a fifth injection horizontal wellbore hydraulic decoder high-pressure integrated control pipeline and a sixth injection horizontal wellbore hydraulic decoder high-pressure integrated control pipeline, outer diameters of production horizontal wellbore hydraulic decoder high-pressure power fluid integrated pipelines, outer diameters of injection horizontal wellbore hydraulic decoder high-pressure power fluid integrated pipelines, outer diameters of production horizontal wellbore external temperature-pressure-streaming potential integrated sensor data collection lines, outer diameters of injection horizontal wellbore external temperature-pressure-streaming potential integrated sensor data collection lines and an internal size of a high-temperature and high-pressure closed rectangular reservoir simulation box, wherein center lines of the first simulation production well section, the second simulation production well section, the third simulation production well section, the fourth simulation production well section, the fifth simulation production well section and the sixth simulation production well section, the first production horizontal wellbore hydraulic decoder, the second production horizontal wellbore hydraulic decoder, the third production horizontal wellbore hydraulic decoder, the fourth production horizontal wellbore hydraulic decoder, the fifth production horizontal wellbore hydraulic decoder and the sixth production horizontal wellbore hydraulic decoder, the first production horizontal wellbore external temperature-pressure-streaming potential integrated sensor, the second production horizontal wellbore external temperature-pressure-streaming potential integrated sensor, the third production horizontal wellbore external temperature-pressure-streaming potential integrated sensor, the fourth production horizontal wellbore external temperature-pressure-streaming potential integrated sensor, the fifth production horizontal wellbore external temperature-pressure-streaming potential integrated sensor and the sixth production horizontal wellbore external temperature-pressure-streaming potential integrated sensor, the first production horizontal wellbore hydraulic decoder high-pressure integrated control pipeline, the second production horizontal wellbore hydraulic decoder high-pressure integrated control pipeline, the third production horizontal wellbore hydraulic decoder high-pressure integrated control pipeline, the fourth production horizontal wellbore hydraulic decoder high-pressure integrated control pipeline, the fifth production horizontal wellbore hydraulic decoder high-pressure integrated control pipeline and the sixth production horizontal wellbore hydraulic decoder high-pressure integrated control pipeline, the production horizontal wellbore hydraulic decoder high-pressure power fluid integrated pipelines, the production horizontal wellbore external temperature-pressure-streaming potential integrated sensor data collection lines, and a first production horizontal wellbore flow control valve, a second production horizontal wellbore flow control valve, a third production horizontal wellbore flow control valve, a fourth production horizontal wellbore flow control valve, a fifth production horizontal wellbore flow control valve and a sixth production horizontal wellbore flow control valve are at the same horizontal line; center lines of the first simulation injection well section, the second simulation injection well section, the third simulation injection well section, the fourth simulation injection well section, the fifth simulation injection well section and the sixth simulation injection well section, the first injection horizontal wellbore hydraulic decoder, the second injection horizontal wellbore hydraulic decoder, the third injection horizontal wellbore hydraulic decoder, the fourth injection horizontal wellbore hydraulic decoder, the fifth injection horizontal wellbore hydraulic decoder and the sixth injection horizontal wellbore hydraulic decoder, the first injection horizontal wellbore external temperature-pressure-streaming potential integrated sensor, the second injection horizontal wellbore external temperature-pressure-streaming potential integrated sensor, the third injection horizontal wellbore external temperature-pressure-streaming potential integrated sensor, the fourth injection horizontal wellbore external temperature-pressure-streaming potential integrated sensor, the fifth injection horizontal wellbore external temperature-pressure-streaming potential integrated sensor and the sixth injection horizontal wellbore external temperature-pressure-streaming potential integrated sensor, the first injection horizontal wellbore hydraulic decoder high-pressure integrated control pipeline, the second injection horizontal wellbore hydraulic decoder high-pressure integrated control pipeline, the third injection horizontal wellbore hydraulic decoder high-pressure integrated control pipeline, the fourth injection horizontal wellbore hydraulic decoder high-pressure integrated control pipeline, the fifth injection horizontal wellbore hydraulic decoder high-pressure integrated control pipeline and the sixth injection horizontal wellbore hydraulic decoder high-pressure integrated control pipeline, the injection horizontal wellbore hydraulic decoder high-pressure power fluid integrated pipeline, the injection horizontal wellbore external temperature-pressure-streaming potential integrated sensor data collection line, and a first injection horizontal wellbore flow control valve, a second injection horizontal wellbore flow control valve, a third injection horizontal wellbore flow control valve, a fourth injection horizontal wellbore flow control valve, a fifth injection horizontal wellbore flow control valve and a sixth injection horizontal wellbore flow control valve are at the same horizontal line; and then, dividing the numerical model of the built reservoir 3D-printed physical model with well axes of the first simulation production well section, the second simulation production well section, the third simulation production well section, the fourth simulation production well section, the fifth simulation production well section and the sixth simulation production well section as the center and well axes of the first simulation injection well section, the second simulation injection well section, the third simulation injection well section, the fourth simulation injection well section, the fifth simulation injection well section and the sixth simulation injection well section as the center; and obtaining the divided reservoir 3D-printed physical model required for an experiment by printing all of the divided numerical models with a 3D printer;

at step 2, sequentially assembling the first production horizontal wellbore flow control valve, the second production horizontal wellbore flow control valve, the third production horizontal wellbore flow control valve, the fourth production horizontal wellbore flow control valve, the fifth production horizontal wellbore flow control valve and the sixth production horizontal wellbore flow control valve on the first simulation production well section, the second simulation production well section, the third simulation production well section, the fourth simulation production well section, the fifth simulation production well section and the sixth simulation production well section; sequentially connecting the first production horizontal wellbore hydraulic decoder, the second production horizontal wellbore hydraulic decoder, the third production horizontal wellbore hydraulic decoder, the fourth production horizontal wellbore hydraulic decoder, the fifth production horizontal wellbore hydraulic decoder and the sixth production horizontal wellbore hydraulic decoder to the first production horizontal wellbore flow control valve, the second production horizontal wellbore flow control valve, the third production horizontal wellbore flow control valve, the fourth production horizontal wellbore flow control valve, the fifth production horizontal wellbore flow control valve and the sixth production horizontal wellbore flow control valve, and attaching the first production horizontal wellbore hydraulic decoder, the second production horizontal wellbore hydraulic decoder, the third production horizontal wellbore hydraulic decoder, the fourth production horizontal wellbore hydraulic decoder, the fifth production horizontal wellbore hydraulic decoder and the sixth production horizontal wellbore hydraulic decoder to the outsides of the first simulation production well section, the second simulation production well section, the third simulation production well section, the fourth simulation production well section, the fifth simulation production well section and the sixth simulation production well section; connecting, in series, the simulation production well section, the second simulation production well section, the third simulation production well section, the fourth simulation production well section, the fifth simulation production well section and the sixth simulation production well section in sequence to form a simulation horizontal production wellbore; connecting three of the first production horizontal wellbore hydraulic decoder high-pressure integrated control pipeline, the second production horizontal wellbore hydraulic decoder high-pressure integrated control pipeline, the third production horizontal wellbore hydraulic decoder high-pressure integrated control pipeline, the fourth production horizontal wellbore hydraulic decoder high-pressure integrated control pipeline, the fifth production horizontal wellbore hydraulic decoder high-pressure integrated control pipeline and the sixth production horizontal wellbore hydraulic decoder high-pressure integrated control pipeline to three of the production horizontal wellbore hydraulic decoder high-pressure power fluid integrated pipelines respectively; connecting, in series, a first production horizontal wellbore internal temperature-pressure integrated sensor, a second production horizontal wellbore internal temperature-pressure integrated sensor, a third production horizontal wellbore internal temperature-pressure integrated sensor, a fourth production horizontal wellbore internal temperature-pressure integrated sensor, a fifth production horizontal wellbore internal temperature-pressure integrated sensor and a sixth production horizontal wellbore internal temperature-pressure integrated sensor by using the production horizontal wellbore internal temperature-pressure integrated sensor data collection lines according to a sequence of a length interval of the first simulation production well section, the second simulation production well section, the third simulation production well section, the fourth simulation production well section, the fifth simulation production well section and the sixth simulation production well section; fixedly placing the series-connected first production horizontal wellbore internal temperature-pressure integrated sensor, second production horizontal wellbore internal temperature-pressure integrated sensor, third production horizontal wellbore internal temperature-pressure integrated sensor, fourth production horizontal wellbore internal temperature-pressure integrated sensor, fifth production horizontal wellbore internal temperature-pressure integrated sensor and sixth production horizontal wellbore internal temperature-pressure integrated sensor inside the first simulation production well section, the second simulation production well section, the third simulation production well section, the fourth simulation production well section, the fifth simulation production well section and the sixth simulation production well section; connecting, in series, the first production horizontal wellbore external temperature-pressure-streaming potential integrated sensor, the second production horizontal wellbore external temperature-pressure-streaming potential integrated sensor, the third production horizontal wellbore external temperature-pressure-streaming potential integrated sensor, the fourth production horizontal wellbore external temperature-pressure-streaming potential integrated sensor, the fifth production horizontal wellbore external temperature-pressure-streaming potential integrated sensor and the sixth production horizontal wellbore external temperature-pressure-streaming potential integrated sensor by using the production horizontal wellbore external temperature-pressure-streaming potential integrated sensor data collection lines according to the sequence of the length interval of the first simulation production well section, the second simulation production well section, the third simulation production well section, the fourth simulation production well section, the fifth simulation production well section and the sixth simulation production well section; attaching the series-connected first production horizontal wellbore external temperature-pressure-streaming potential integrated sensor, second production horizontal wellbore external temperature-pressure-streaming potential integrated sensor, third production horizontal wellbore external temperature-pressure-streaming potential integrated sensor, fourth production horizontal wellbore external temperature-pressure-streaming potential integrated sensor, fifth production horizontal wellbore external temperature-pressure-streaming potential integrated sensor and sixth production horizontal wellbore external temperature-pressure-streaming potential integrated sensor to the outsides of the first simulation production well section, the second simulation production well section, the third simulation production well section, the fourth simulation production well section, the fifth simulation production well section and the sixth simulation production well section; ensuring center lines of the first simulation production well section, the second simulation production well section, the third simulation production well section, the fourth simulation production well section, the fifth simulation production well section and the sixth simulation production well section, the first production horizontal wellbore hydraulic decoder, the second production horizontal wellbore hydraulic decoder, the third production horizontal wellbore hydraulic decoder, the fourth production horizontal wellbore hydraulic decoder, the fifth production horizontal wellbore hydraulic decoder and the sixth production horizontal wellbore hydraulic decoder, the first production horizontal wellbore external temperature-pressure-streaming potential integrated sensor, the second production horizontal wellbore external temperature-pressure-streaming potential integrated sensor, the third production horizontal wellbore external temperature-pressure-streaming potential integrated sensor, the fourth production horizontal wellbore external temperature-pressure-streaming potential integrated sensor, the fifth production horizontal wellbore external temperature-pressure-streaming potential integrated sensor and the sixth production horizontal wellbore external temperature-pressure-streaming potential integrated sensor, the first production horizontal wellbore hydraulic decoder high-pressure integrated control pipeline, the second production horizontal wellbore hydraulic decoder high-pressure integrated control pipeline, the third production horizontal wellbore hydraulic decoder high-pressure integrated control pipeline, the fourth production horizontal wellbore hydraulic decoder high-pressure integrated control pipeline, the fifth production horizontal wellbore hydraulic decoder high-pressure integrated control pipeline and the sixth production horizontal wellbore hydraulic decoder high-pressure integrated control pipeline, the production horizontal wellbore hydraulic decoder high-pressure power fluid integrated pipelines, the production horizontal wellbore external temperature-pressure-streaming potential integrated sensor data collection lines, and the first production horizontal wellbore flow control valve, the second production horizontal wellbore flow control valve, the third production horizontal wellbore flow control valve, the fourth production horizontal wellbore flow control valve, the fifth production horizontal wellbore flow control valve and the sixth production horizontal wellbore flow control valve to be at the same horizontal line, to complete assembly of a simulation production horizontal wellbore system;

at step 3, sequentially assembling the first injection horizontal wellbore flow control valve, the second injection horizontal wellbore flow control valve, the third injection horizontal wellbore flow control valve, the fourth injection horizontal wellbore flow control valve, the fifth injection horizontal wellbore flow control valve and the sixth injection horizontal wellbore flow control valve on the first simulation injection well section, the second simulation injection well section, the third simulation injection well section, the fourth simulation injection well section, the fifth simulation injection well section and the sixth simulation injection well section; sequentially connecting the first injection horizontal wellbore hydraulic decoder, the second injection horizontal wellbore hydraulic decoder, the third injection horizontal wellbore hydraulic decoder, the fourth injection horizontal wellbore hydraulic decoder, the fifth injection horizontal wellbore hydraulic decoder and the sixth injection horizontal wellbore hydraulic decoder to the first injection horizontal wellbore flow control valve, the second injection horizontal wellbore flow control valve, the third injection horizontal wellbore flow control valve, the fourth injection horizontal wellbore flow control valve, the fifth injection horizontal wellbore flow control valve and the sixth injection horizontal wellbore flow control valve, and attaching the first injection horizontal wellbore hydraulic decoder, the second injection horizontal wellbore hydraulic decoder, the third injection horizontal wellbore hydraulic decoder, the fourth injection horizontal wellbore hydraulic decoder, the fifth injection horizontal wellbore hydraulic decoder and the sixth injection horizontal wellbore hydraulic decoder to the outsides of the first simulation injection well section, the second simulation injection well section, the third simulation injection well section, the fourth simulation injection well section, the fifth simulation injection well section and the sixth simulation injection well section; connecting, in series, the simulation injection well section, the second simulation injection well section, the third simulation injection well section, the fourth simulation injection well section, the fifth simulation injection well section and the sixth simulation injection well section in sequence to form a simulation horizontal injection wellbore; connecting three of the first injection horizontal wellbore hydraulic decoder high-pressure integrated control pipeline, the second injection horizontal wellbore hydraulic decoder high-pressure integrated control pipeline, the third injection horizontal wellbore hydraulic decoder high-pressure integrated control pipeline, the fourth injection horizontal wellbore hydraulic decoder high-pressure integrated control pipeline, the fifth injection horizontal wellbore hydraulic decoder high-pressure integrated control pipeline and the sixth injection horizontal wellbore hydraulic decoder high-pressure integrated control pipeline to three of the injection horizontal wellbore hydraulic decoder high-pressure power fluid integrated pipelines respectively; connecting, in series, a first injection horizontal wellbore internal temperature-pressure integrated sensor, a second injection horizontal wellbore internal temperature-pressure integrated sensor, a third injection horizontal wellbore internal temperature-pressure integrated sensor, a fourth injection horizontal wellbore internal temperature-pressure integrated sensor, a fifth injection horizontal wellbore internal temperature-pressure integrated sensor and a sixth injection horizontal wellbore internal temperature-pressure integrated sensor by using the injection horizontal wellbore internal temperature-pressure integrated sensor data collection lines according to a sequence of a length interval of the first simulation injection well section, the second simulation injection well section, the third simulation injection well section, the fourth simulation injection well section, the fifth simulation injection well section and the sixth simulation injection well section; fixedly placing the series-connected first injection horizontal wellbore internal temperature-pressure integrated sensor, second injection horizontal wellbore internal temperature-pressure integrated sensor, third injection horizontal wellbore internal temperature-pressure integrated sensor, fourth injection horizontal wellbore internal temperature-pressure integrated sensor, fifth injection horizontal wellbore internal temperature-pressure integrated sensor and sixth injection horizontal wellbore internal temperature-pressure integrated sensor inside the first simulation injection well section, the second simulation injection well section, the third simulation injection well section, the fourth simulation injection well section, the fifth simulation injection well section and the sixth simulation injection well section; connecting, in series, the first injection horizontal wellbore external temperature-pressure-streaming potential integrated sensor, the second injection horizontal wellbore external temperature-pressure-streaming potential integrated sensor, the third injection horizontal wellbore external temperature-pressure-streaming potential integrated sensor, the fourth injection horizontal wellbore external temperature-pressure-streaming potential integrated sensor, the fifth injection horizontal wellbore external temperature-pressure-streaming potential integrated sensor and the sixth injection horizontal wellbore external temperature-pressure-streaming potential integrated sensor by using the injection horizontal wellbore external temperature-pressure-streaming potential integrated sensor data collection lines according to the sequence of the length interval of the first simulation injection well section, the second simulation injection well section, the third simulation injection well section, the fourth simulation injection well section, the fifth simulation injection well section and the sixth simulation injection well section; attaching the series-connected first injection horizontal wellbore external temperature-pressure-streaming potential integrated sensor, second injection horizontal wellbore external temperature-pressure-streaming potential integrated sensor, third injection horizontal wellbore external temperature-pressure-streaming potential integrated sensor, fourth injection horizontal wellbore external temperature-pressure-streaming potential integrated sensor, fifth injection horizontal wellbore external temperature-pressure-streaming potential integrated sensor and sixth injection horizontal wellbore external temperature-pressure-streaming potential integrated sensor to the outsides of the first simulation injection well section, the second simulation injection well section, the third simulation injection well section, the fourth simulation injection well section, the fifth simulation injection well section and the sixth simulation injection well section; ensuring center lines of the first simulation injection well section, the second simulation injection well section, the third simulation injection well section, the fourth simulation injection well section, the fifth simulation injection well section and the sixth simulation injection well section, the first injection horizontal wellbore hydraulic decoder, the second injection horizontal wellbore hydraulic decoder, the third injection horizontal wellbore hydraulic decoder, the fourth injection horizontal wellbore hydraulic decoder, the fifth injection horizontal wellbore hydraulic decoder and the sixth injection horizontal wellbore hydraulic decoder, the first injection horizontal wellbore external temperature-pressure-streaming potential integrated sensor, the second injection horizontal wellbore external temperature-pressure-streaming potential integrated sensor, the third injection horizontal wellbore external temperature-pressure-streaming potential integrated sensor, the fourth injection horizontal wellbore external temperature-pressure-streaming potential integrated sensor, the fifth injection horizontal wellbore external temperature-pressure-streaming potential integrated sensor and the sixth injection horizontal wellbore external temperature-pressure-streaming potential integrated sensor, the first injection horizontal wellbore hydraulic decoder high-pressure integrated control pipeline, the second injection horizontal wellbore hydraulic decoder high-pressure integrated control pipeline, the third injection horizontal wellbore hydraulic decoder high-pressure integrated control pipeline, the fourth injection horizontal wellbore hydraulic decoder high-pressure integrated control pipeline, the fifth injection horizontal wellbore hydraulic decoder high-pressure integrated control pipeline and the sixth injection horizontal wellbore hydraulic decoder high-pressure integrated control pipeline, the injection horizontal wellbore hydraulic decoder high-pressure power fluid integrated pipeline, the injection horizontal wellbore external temperature-pressure-streaming potential integrated sensor data collection line, and the first injection horizontal wellbore flow control valve, the second injection horizontal wellbore flow control valve, the third injection horizontal wellbore flow control valve, the fourth injection horizontal wellbore flow control valve, the fifth injection horizontal wellbore flow control valve and the sixth injection horizontal wellbore flow control valve to be at the same horizontal line, to complete the assembly of a simulation injection horizontal wellbore system;

at step 4, assembling the simulation production horizontal wellbore system assembled at step 2, the simulation injection horizontal wellbore system assembled at step 3, and the divided reservoir 3D-printed physical model printed at step 1 into a physical model with a reservoir and wellbore coupled; leading the production horizontal wellbore external temperature-pressure-streaming potential integrated sensor data collection line, the production horizontal wellbore internal temperature-pressure integrated sensor data collection line, the injection horizontal wellbore external temperature-pressure-streaming potential integrated sensor data collection line, the injection horizontal wellbore internal temperature-pressure integrated sensor data collection line, the production horizontal wellbore hydraulic decoder high-pressure power fluid integrated pipeline, the injection horizontal wellbore hydraulic decoder high-pressure power fluid integrated pipeline, an injection horizontal wellbore high-pressure injection pipeline and a production horizontal wellbore high-pressure outflow pipeline out of the high-temperature and high-pressure closed rectangular reservoir simulation box through through-holes around the high-temperature and high-pressure closed rectangular reservoir simulation box; placing the assembled physical model with the coupled reservoir and wellbore inside the high-temperature and high-pressure closed rectangular reservoir simulation box, and tightly bonding the periphery of the model to an inner wall surface of the high-temperature and high-pressure closed rectangular reservoir simulation box by using a high temperature resistant gel; and firmly connecting a bottom cover and a top cover to the body of the high-temperature and high-pressure closed rectangular reservoir simulation box by bolts to form a sealed system;

at step 5, connecting the production horizontal wellbore high-pressure outflow pipeline to the first simulation production well section in the simulation production horizontal wellbore system; connecting one end of an electric automatically-adjusted back pressure valve to the production horizontal wellbore high-pressure outflow pipeline, and connecting the other end of the electric automatically-adjusted back pressure valve to a fluid collection tank through a fluid collection tank fluid collection pipeline; connecting the injection horizontal wellbore high-pressure injection pipeline to the first simulation injection well section in the simulation injection horizontal wellbore system; connecting one end of an injection horizontal wellbore plunger pump to the injection horizontal wellbore high-pressure injection pipeline, and connecting the other end of the injection horizontal wellbore plunger pump to a fluid supply tank through a fluid supply tank fluid discharge pipeline; and connecting a production horizontal wellbore hydraulic decoder drive system to the production horizontal wellbore hydraulic decoder high-pressure power fluid integrated pipeline and to a high-pressure power fluid storage tank through a production horizontal wellbore high-pressure power fluid storage tank output pipeline, and connecting an injection horizontal wellbore hydraulic decoder drive system to the injection horizontal wellbore hydraulic decoder high-pressure power fluid integrated pipeline and to the high-pressure power fluid storage tank through an injection horizontal wellbore high-pressure power fluid storage tank output pipeline P;

at step 6, connecting the production horizontal wellbore external temperature-pressure-streaming potential integrated sensor data collection line, the production horizontal wellbore internal temperature-pressure integrated sensor data collection line, the injection horizontal wellbore external temperature-pressure-streaming potential integrated sensor data collection line, the injection horizontal wellbore internal temperature-pressure integrated sensor data collection line, a back pressure valve control pipeline, a plunger pump control pipeline, a production end power fluid control pipeline and an injection end power fluid control pipeline to a computer data collection and control system respectively;

at step 7, vacuumizing the high-temperature and high-pressure closed rectangular reservoir simulation box; and performing water saturation for the reservoir 3D-printed physical model through the first simulation injection well section, the second simulation injection well section, the third simulation injection well section, the fourth simulation injection well section, the fifth simulation injection well section and the sixth simulation injection well section and recording a volume of the water used for saturation;

at step 8, performing medium oil saturation for the reservoir 3D-printed physical model through the first simulation injection well section, the second simulation injection well section, the third simulation injection well section, the fourth simulation injection well section, the fifth simulation injection well section and the sixth simulation injection well section and recording a volume of the medium oil used for saturation;

at step 9, starting the computer data collection and control system to import the numerical model of the reservoir 3D-printed physical model built at step 1 into a reservoir development simulation automatic historical fitting software; setting a total injection volume in a smart oilfield development and production optimization decision-making software, and setting all the opening degrees of the first injection horizontal wellbore flow control valve, the second injection horizontal wellbore flow control valve, the third injection horizontal wellbore flow control valve, the fourth injection horizontal wellbore flow control valve, the fifth injection horizontal wellbore flow control valve and the sixth injection horizontal wellbore flow control valve of the first simulation injection well section, the second simulation injection well section, the third simulation injection well section, the fourth simulation injection well section, the fifth simulation injection well section and the sixth simulation injection well section and the opening degrees of the first production horizontal wellbore flow control valve, the second production horizontal wellbore flow control valve, the third production horizontal wellbore flow control valve, the fourth production horizontal wellbore flow control valve, the fifth production horizontal wellbore flow control valve and the sixth production horizontal wellbore flow control valve of the first simulation production well section, the second simulation production well section, the third simulation production well section, the fourth simulation production well section, the fifth simulation production well section and the sixth simulation production well section to fully open at the same time, setting a back pressure value of the simulation horizontal production wellbore formed by series-connecting the first simulation production well section, the second simulation production well section, the third simulation production well section, the fourth simulation production well section, the fifth simulation production well section and the sixth simulation production well section, and converting the above set value into instructions and sending the instructions to the injection horizontal wellbore plunger pump, the injection horizontal wellbore hydraulic decoder drive system, the production horizontal wellbore hydraulic decoder drive system and the electric automatically-adjusted back pressure valve respectively for start of the experiment;

at step 10, collecting, by the computer data collection and control system, temperature, pressure and streaming potential data outside the first simulation production well section, the second simulation production well section, the third simulation production well section, the fourth simulation production well section, the fifth simulation production well section and the sixth simulation production well section, temperature and pressure data inside the first production well section, the second simulation production well section, the third simulation production well section, the fourth simulation production well section, the fifth simulation production well section and the sixth simulation production well section, temperature, pressure and streaming potential data outside the first simulation injection well section, the second simulation injection well section, the third simulation injection well section, the fourth simulation injection well section, the fifth simulation injection well section and the sixth simulation injection well section, and temperature and pressure data inside the first simulation injection well section, the second simulation injection well section, the third simulation injection well section, the fourth simulation injection well section, the fifth simulation injection well section and the sixth simulation injection well section in real time through the production horizontal wellbore external temperature-pressure-streaming potential integrated sensor data collection line, the production horizontal wellbore internal temperature-pressure integrated sensor data collection line, the injection horizontal wellbore external temperature-pressure-streaming potential integrated sensor data collection line and the injection horizontal wellbore internal temperature-pressure integrated sensor data collection line; extracting, by a smart well long-term downhole pressure monitoring data processing and interpretation software, the above collected data at a certain time interval to obtain respective flows and water contents of the first simulation production well section, the second simulation production well section, the third simulation production well section, the fourth simulation production well section, the fifth simulation production well section and the sixth simulation production well section and water-drive front positions in the reservoir 3D-printed physical model and respective flows of the first simulation injection well section, the second simulation injection well section, the third simulation injection well section, the fourth simulation injection well section, the fifth simulation injection well section and the sixth simulation injection well section through calculation and analysis, and transmitting the data to the reservoir development simulation automatic historical fitting software through a data interface;

at step 11, performing, by the reservoir development simulation automatic historical fitting software, automatic historical fitting calculation based on a result calculated and analyzed in the smart well long-term downhole pressure monitoring data processing and interpretation software to obtain oil-water distribution and pressure field distribution in the reservoir 3D-printed physical model, and transmitting the data to the smart oilfield development and production optimization decision-making software through the data interface;

at step 12, performing, by the smart oilfield development and production optimization decision-making software, injection production optimization with a goal of maximizing a recovery rate based on the result calculated and analyzed in the reservoir development simulation automatic historical fitting software to obtain respective optimal adjustment flows of the first simulation production well section, the second simulation production well section, the third simulation production well section, the fourth simulation production well section, the fifth simulation production well section and the sixth simulation production well section and the first simulation injection well section, the second simulation injection well section, the third simulation injection well section, the fourth simulation injection well section, the fifth simulation injection well section and sixth simulation injection well section at the next time step; and converting, by the smart oilfield development and production optimization decision-making software, the respective optimal adjustment flows at the next time step into instructions, and sending the instructions to the injection horizontal wellbore plunger pump, the injection horizontal wellbore hydraulic decoder drive system and the production horizontal wellbore hydraulic decoder drive system respectively, to start the next water-drive reservoir injection production adjustment period; and at step 13, repeating steps 10-12 until a comprehensive water content of the simulation horizontal production wellbore formed by series-connecting the first simulation production well section, the second simulation production well section, the third simulation production well section, the fourth simulation production well section, the fifth simulation production well section and the sixth simulation production well section reaches 98%.

9. The simulation experimental method for real-time optimization and adjustment of smart oilfield injection production according to claim 8, wherein in an improvement, the simulation production wellbore formed by series-connecting the first simulation production well section, the second simulation production well section, the third simulation production well section, the fourth simulation production well section, the fifth simulation production well section and the sixth simulation production well section, and the simulation injection wellbore formed by series-connecting the first simulation injection well section, the second simulation injection well section, the third simulation injection well section, the fourth simulation injection well section, the fifth simulation injection well section and the sixth simulation injection well section are placed in a vertical or inclined manner to simulate real-time optimization and adjustment of one-injection-one-production vertical well or inclined well injection production; or, the simulation production wellbore and the simulation injection wellbore are combined in a horizontal, vertical or inclined manner to simulate different well combinations of horizontal well and vertical well, horizontal well and inclined well, and vertical well and inclined well; the number of simulation production well sections is 1, 2, 10, or any number of sections with a minimum of one section, and the number of simulation injection well sections is 1, 2, 10, or any number of sections, with a minimum of one section; the number of simulation production well sections and the number of simulation injection well sections are identical or different; a displacement medium is a polymer, chemical agent or gas; the reservoir 3D-printed physical model has heterogeneous longitudinal permeability, and comprises at least two types of different permeabilities, or the reservoir 3D-printed physical model has longitudinal and planar heterogeneous permeabilities at the same time; fractures and holes are disposed in the reservoir 3D-printed physical model.

* * * * *